(12) United States Patent
Yamazaki et al.

(10) Patent No.: US 7,709,844 B2
(45) Date of Patent: May 4, 2010

(54) SEMICONDUCTOR DEVICE EQUIPPED WITH SEMICONDUCTOR CIRCUITS COMPOSED OF SEMICONDUCTOR ELEMENTS AND PROCESSES FOR PRODUCTION THEREOF

(75) Inventors: Shunpei Yamazaki, Setagaya (JP); Etsuko Fujimoto, Atsugi (JP); Atsuo Isobe, Atsugi (JP); Toru Takayama, Atsugi (JP); Kunihiko Fukuchi, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 61 days.

(21) Appl. No.: 11/480,429

(22) Filed: Jul. 5, 2006

(65) Prior Publication Data

US 2006/0278878 A1 Dec. 14, 2006

Related U.S. Application Data

(62) Division of application No. 10/815,701, filed on Apr. 2, 2004, now Pat. No. 7,078,768, which is a division of application No. 10/338,025, filed on Jan. 8, 2003, now Pat. No. 6,822,293, which is a division of application No. 09/641,768, filed on Aug. 21, 2000, now Pat. No. 6,608,357, which is a division of application No. 09/353,282, filed on Jul. 14, 1999, now Pat. No. 6,144,082.

(30) Foreign Application Priority Data

Jul. 16, 1998 (JP) .................................. 10-202377

(51) Int. Cl.
*H01L 27/14* (2006.01)
(52) U.S. Cl. .......................................... 257/72; 257/59
(58) Field of Classification Search .................. 257/72, 257/59
See application file for complete search history.

(56) References Cited

U.S. PATENT DOCUMENTS

| 5,054,887 | A | | 10/1991 | Kato et al. | |
|---|---|---|---|---|---|
| 5,166,816 | A | | 11/1992 | Kaneko et al. | |
| 5,187,602 | A | * | 2/1993 | Ikeda et al. | ................... 349/39 |

(Continued)

FOREIGN PATENT DOCUMENTS

EP 0 372 821 6/1990

(Continued)

OTHER PUBLICATIONS

Machine translation of JP08-046186 is attached.*

*Primary Examiner*—Wai-Sing Louie
*Assistant Examiner*—Bilkis Jahan
(74) *Attorney, Agent, or Firm*—Eric J. Robinson; Robinson Intellectual Property Law Office, P.C.

(57) ABSTRACT

A semiconductor device and a process for production thereof, said semiconductor device having a new electrode structure which has a low resistivity and withstands heat treatment at 400° C. and above. Heat treatment at a high temperature (400-700° C.) is possible because the wiring is made of Ta film or Ta-based film having high heat resistance. This heat treatment permits the gettering of metal element in crystalline silicon film. Since this heat treatment is lower than the temperature which the gate wiring (0.1-5 μm wide) withstands and the gate wiring is protected with a protective film, the gate wiring retains its low resistance.

18 Claims, 14 Drawing Sheets

U.S. PATENT DOCUMENTS

| | | | |
|---|---|---|---|
| 5,188,976 A * | 2/1993 | Kume et al. ............... 438/258 |
| 5,327,001 A | 7/1994 | Wakai et al. |
| 5,428,250 A | 6/1995 | Ikeda et al. |
| 5,555,112 A | 9/1996 | Oritsuki et al. |
| 5,576,556 A | 11/1996 | Takemura et al. |
| 5,608,232 A | 3/1997 | Yamazaki et al. |
| 5,610,737 A | 3/1997 | Akiyama et al. |
| 5,614,728 A | 3/1997 | Akiyama |
| 5,639,698 A | 6/1997 | Yamazaki et al. |
| 5,670,795 A | 9/1997 | Ikeda |
| 5,698,902 A | 12/1997 | Uehara et al. |
| 5,710,453 A | 1/1998 | Bryant |
| 5,712,494 A | 1/1998 | Akiyama et al. |
| 5,714,786 A | 2/1998 | Gonzalez et al. |
| 5,811,835 A | 9/1998 | Seiki et al. |
| 5,845,166 A | 12/1998 | Fellegara et al. |
| 5,846,871 A | 12/1998 | Lee et al. |
| 5,852,481 A | 12/1998 | Hwang |
| 5,880,508 A | 3/1999 | Wu |
| 5,888,855 A | 3/1999 | Nagahisa et al. |
| 5,897,347 A | 4/1999 | Yamazaki et al. |
| 5,917,199 A * | 6/1999 | Byun et al. ............... 257/59 |
| 5,923,968 A | 7/1999 | Yamazaki et al. |
| 5,923,970 A | 7/1999 | Kirlin |
| 5,926,235 A | 7/1999 | Han et al. |
| 5,952,701 A | 9/1999 | Bulucea et al. |
| 5,952,708 A | 9/1999 | Yamazaki |
| 5,956,579 A | 9/1999 | Yamazaki et al. |
| 5,962,897 A | 10/1999 | Takemura et al. |
| 5,962,904 A | 10/1999 | Hu |
| 5,986,312 A | 11/1999 | Kuroda |
| 5,994,734 A | 11/1999 | Chou |
| 6,015,997 A | 1/2000 | Hu et al. |
| 6,017,789 A | 1/2000 | Sandhu et al. |
| 6,037,611 A | 3/2000 | Jang et al. |
| 6,078,366 A | 6/2000 | Dohjo et al. |
| 6,084,247 A | 7/2000 | Yamazaki et al. |
| 6,097,452 A * | 8/2000 | Shimada et al. ............... 349/38 |
| 6,144,082 A | 11/2000 | Yamazaki et al. |
| 6,169,293 B1 | 1/2001 | Yamazaki |
| 6,188,452 B1 | 2/2001 | Kim et al. |
| 6,218,678 B1 | 4/2001 | Zhang et al. |
| 6,235,561 B1 | 5/2001 | Seiki et al. |
| 6,239,470 B1 | 5/2001 | Yamazaki |
| 6,252,248 B1 | 6/2001 | Sano et al. |
| 6,271,543 B1 | 8/2001 | Ohtani et al. |
| 6,342,936 B1 * | 1/2002 | Murayama et al. ............ 349/141 |
| 6,359,672 B2 | 3/2002 | Gu et al. |
| 6,459,124 B1 | 10/2002 | Zhang et al. |
| 6,528,360 B2 | 3/2003 | Zhang et al. |
| 6,541,313 B2 | 4/2003 | Zhang et al. |
| 6,599,790 B1 | 7/2003 | Yamazaki et al. |
| 6,608,357 B1 | 8/2003 | Yamazaki et al. |
| 6,800,875 B1 | 10/2004 | Yamazaki |
| 6,867,431 B2 | 3/2005 | Konuma et al. |
| 6,867,434 B2 | 3/2005 | Yamazaki |
| 7,361,931 B2 | 4/2008 | Yamazaki |
| 2005/0082529 A1 | 4/2005 | Yamazaki |
| 2008/0315202 A1 | 12/2008 | Yamazaki |

FOREIGN PATENT DOCUMENTS

| | | |
|---|---|---|
| EP | 0 612 102 A2 | 8/1994 |
| EP | 0613038 A | 8/1994 |
| EP | 0683525 A | 11/1995 |
| EP | 0 612 102 B1 | 9/2001 |
| JP | 62-145870 | 6/1987 |
| JP | 63-316477 | 12/1988 |
| JP | 64-023575 | 1/1989 |
| JP | 64-066979 | 3/1989 |
| JP | 64-068967 A | 3/1989 |
| JP | 02-244676 A | 9/1990 |
| JP | 06-095149 A | 4/1994 |
| JP | 6-151853 | 5/1994 |
| JP | 06-163581 | 6/1994 |
| JP | 6-232059 | 8/1994 |
| JP | 06-232059 | 8/1994 |
| JP | 06-244103 | 9/1994 |
| JP | 06-250211 A | 9/1994 |
| JP | 06-267978 | 9/1994 |
| JP | 7-130652 | 5/1995 |
| JP | 07-318978 A | 12/1995 |
| JP | 7-321339 | 12/1995 |
| JP | 08-046186 * | 2/1996 |
| JP | 08-204200 A | 8/1996 |
| JP | 08-228011 A | 9/1996 |
| JP | 08-236471 | 9/1996 |
| JP | 08-264790 | 10/1996 |
| JP | 08-279615 | 10/1996 |
| JP | 8-330602 | 12/1996 |
| JP | 09-064366 A | 3/1997 |
| JP | 09-181319 | 7/1997 |
| JP | 09-197390 | 7/1997 |
| JP | 09-283761 | 10/1997 |
| JP | 9-312260 | 12/1997 |
| JP | 10-048668 | 2/1998 |
| JP | 10-064842 | 3/1998 |
| JP | 10-107293 A | 4/1998 |
| JP | 10-189981 | 7/1998 |
| JP | 10-209458 | 8/1998 |
| JP | 11-214699 | 8/1999 |
| JP | 11-354802 | 12/1999 |

* cited by examiner

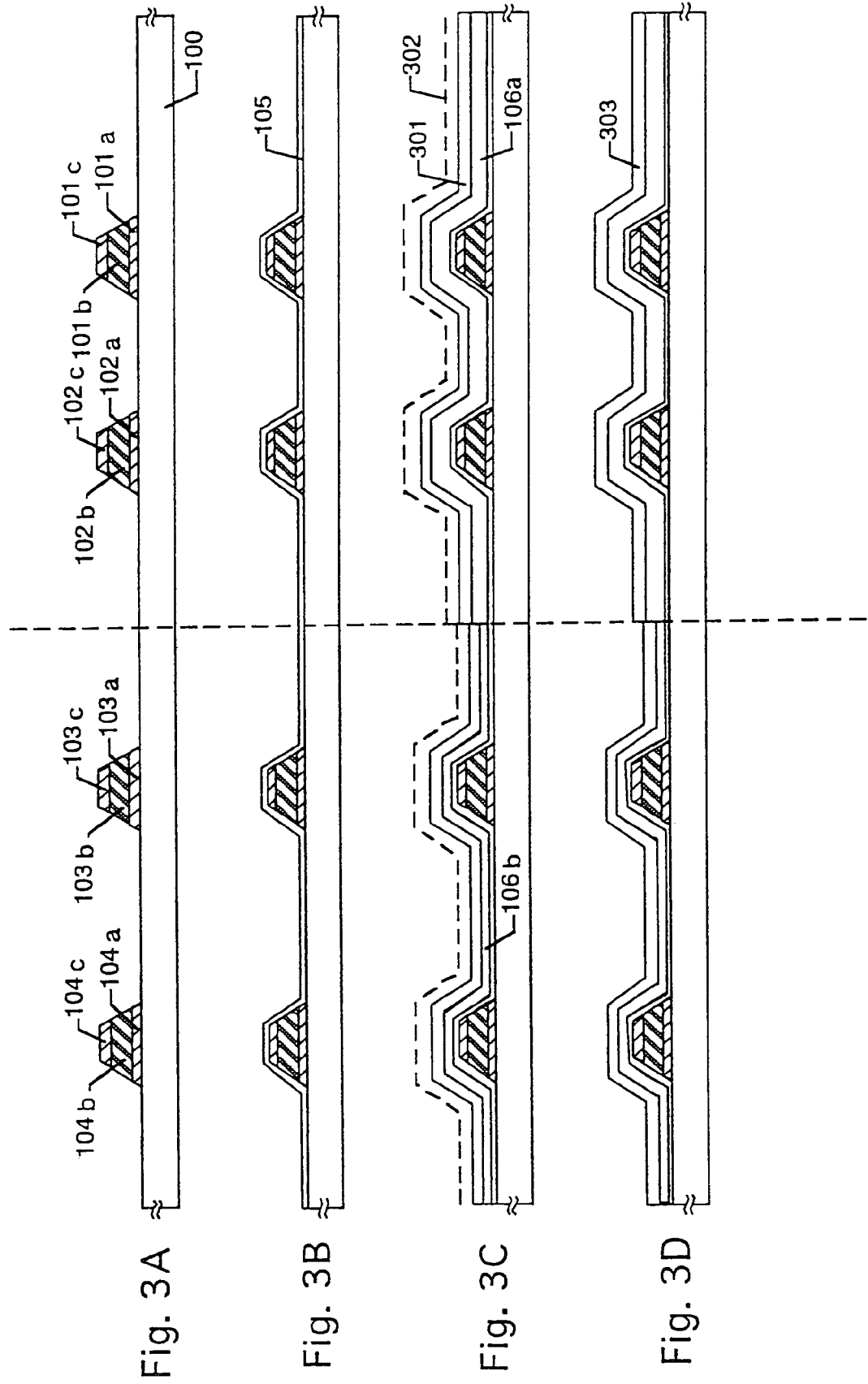

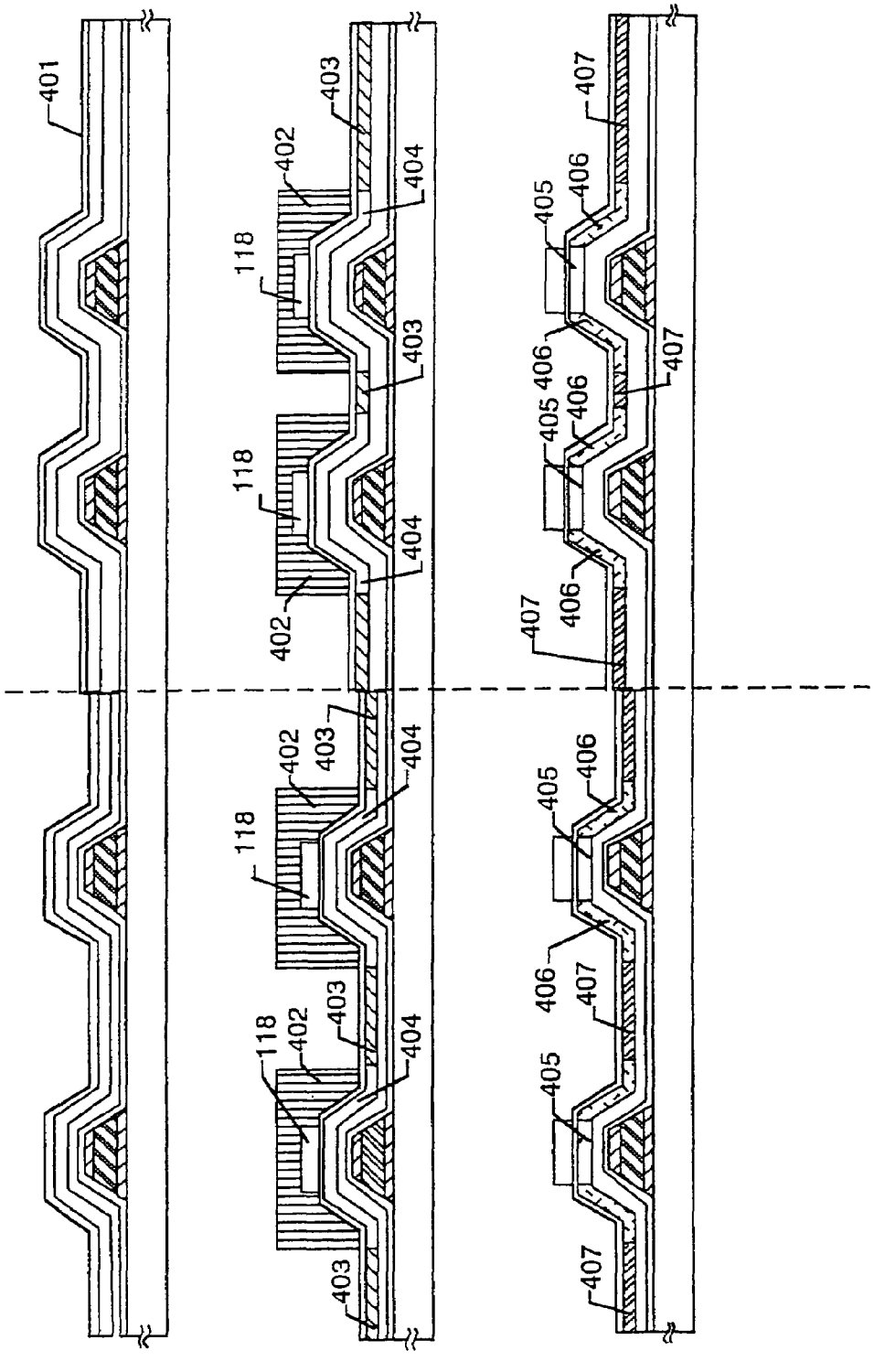

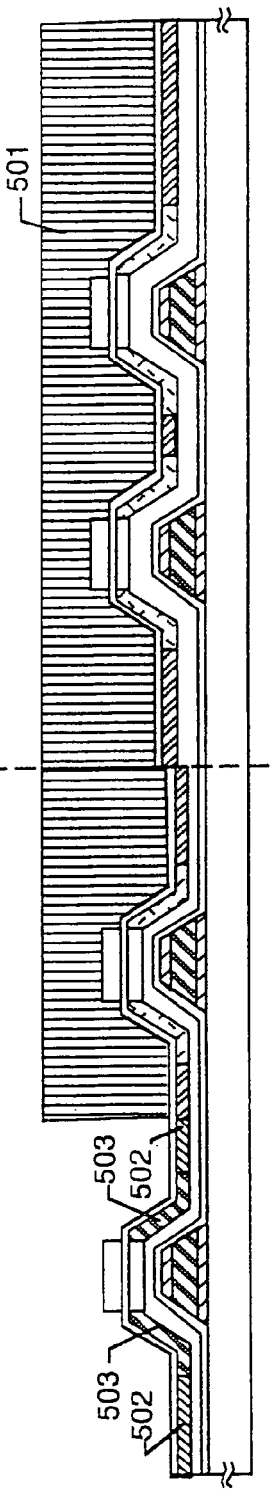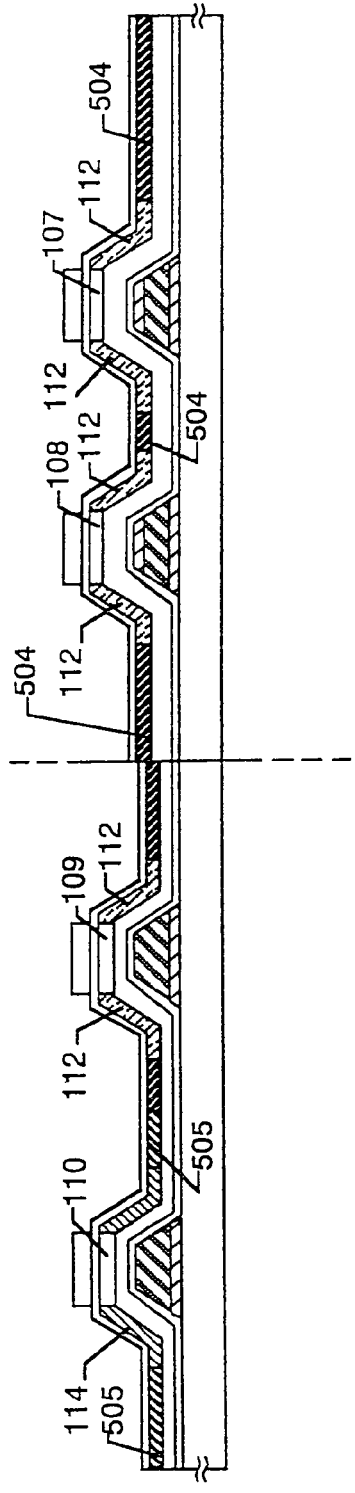

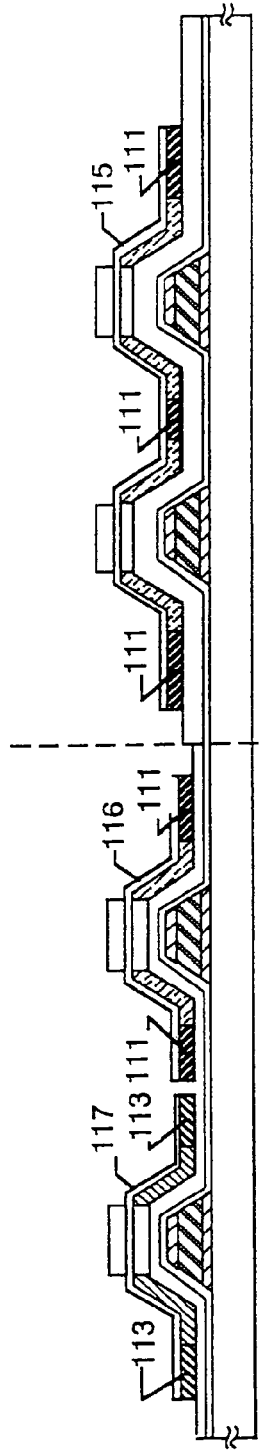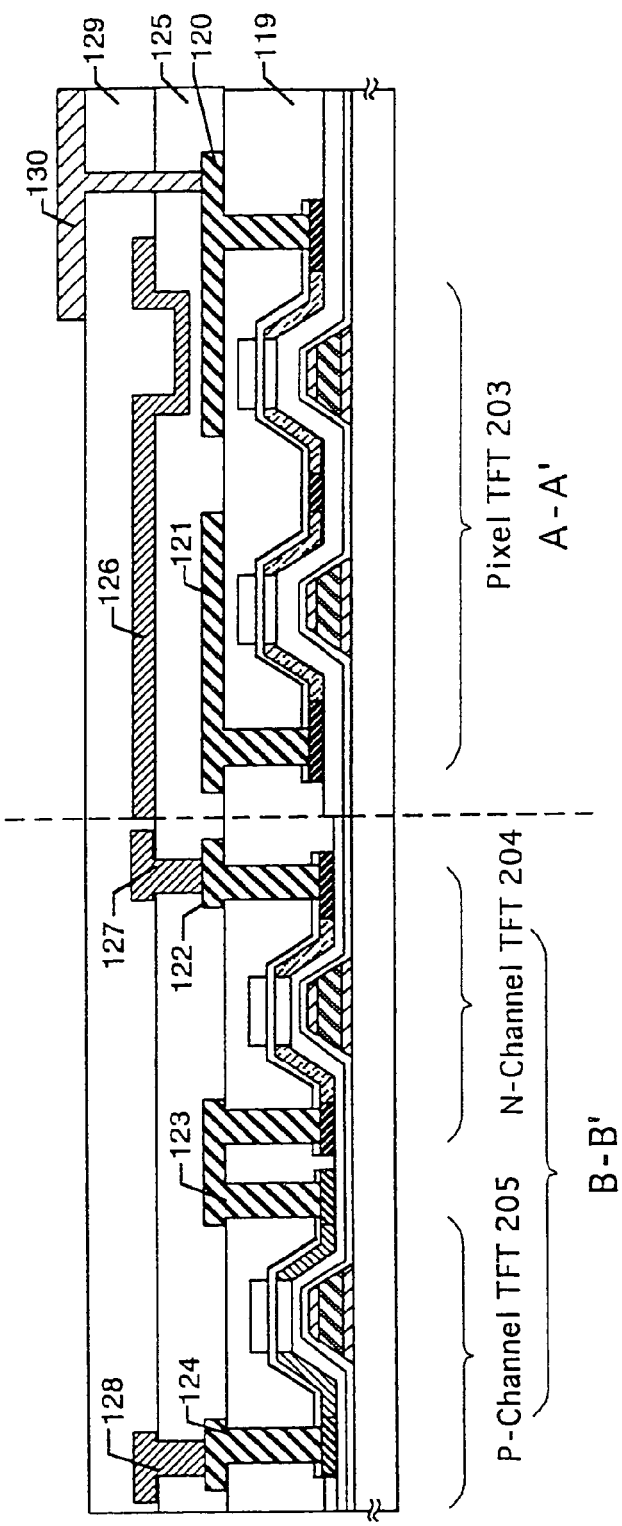

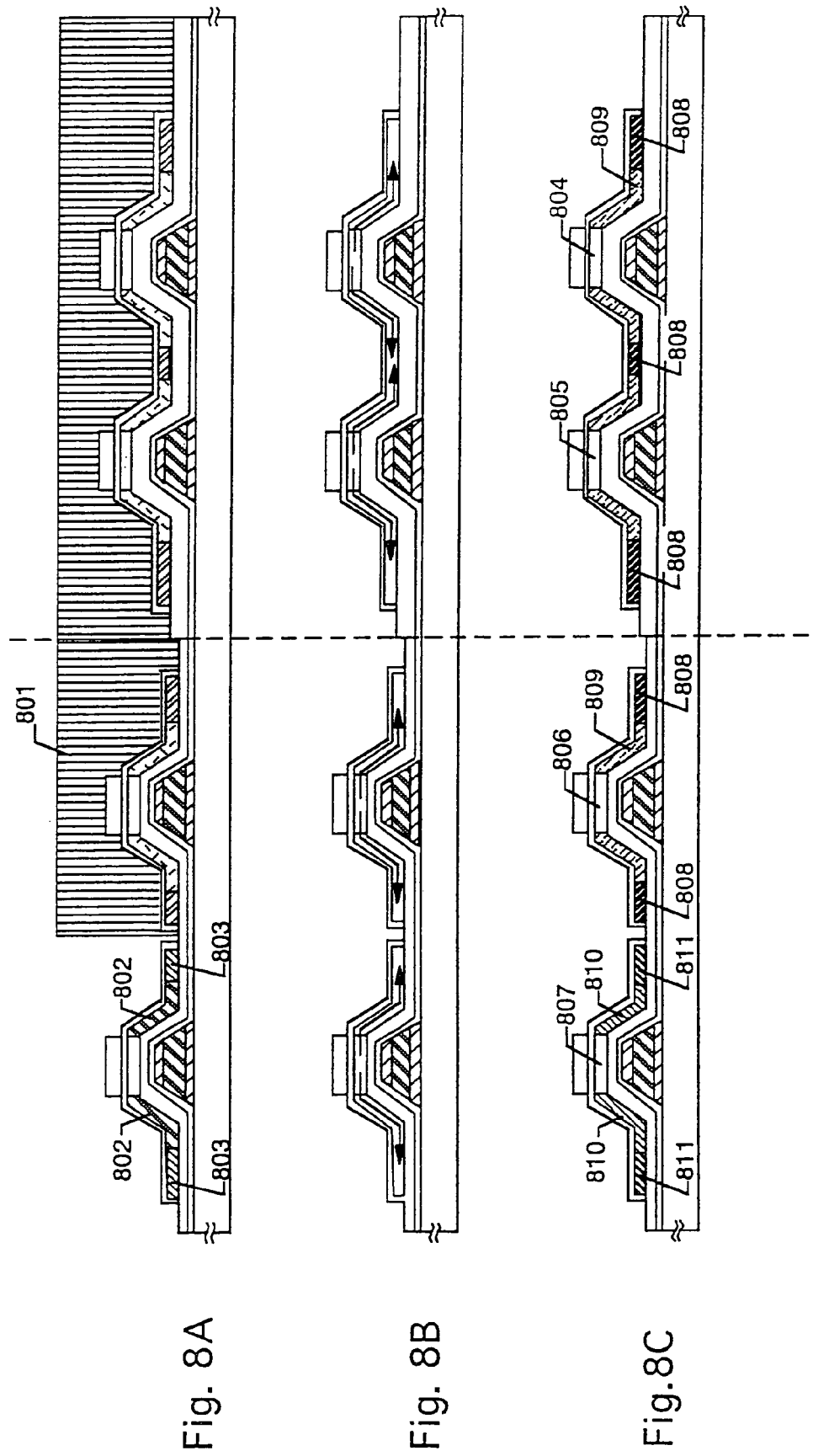

SEMICONDUCTOR DEVICE EQUIPPED WITH SEMICONDUCTOR CIRCUITS COMPOSED OF SEMICONDUCTOR ELEMENTS AND PROCESSES FOR PRODUCTION THEREOF

BACKGROUND OF THE INVENTION

1. Field of the Invention

The present invention relates to a structure of a semiconductor device equipped with semiconductor circuits composed of semiconductor elements such as insulated gate transistors, and also to a process for producing the same.

More particularly, the present invention relates to a semiconductor device equipped with semiconductor circuits composed of semiconductor elements having wiring of tantalum material and also to a process for producing the same. The semiconductor device of the present invention includes not only such elements as thin film transistors (TFT) and MOS transistors but also display units having semiconductor circuits composed of said insulated gate transistors and electro-optical units such as image sensors. Moreover, the semiconductor device of the present invention also includes electronic machines and equipment equipped with such display units and electro-optical units.

2. Description of the Related Art

Much attention is being devoted to active matrix liquid crystal displays in which the pixel matrix circuits and drive circuits are constructed of thin film transistors (TFT) formed on an insulating substrate. Liquid crystal displays in use have a size ranging from 0.5 to 20 inches.

One of the developmental works for liquid crystal displays is directed to increasing their display area. Unfortunately, according as the display area increases, the pixel matrix circuits for pixel displays also increase in area. As the result, the source wiring and gate wiring arranged in matrix become longer, resulting in an increased wiring resistance. Moreover, in order to meet the requirement for finer pitches, it is necessary to make wiring smaller. This causes the wiring resistance to increase remarkably. Since TFTs are connected to the source wiring and gate wiring for individual pixels, an increased number of pixels leads to an increased parasitic capacity. Liquid crystal displays are usually have the gate wiring and gate electrode formed integrally, and hence the gate signal delay becomes significant according as the panel area increases.

Therefore, if the gate electrode wiring is made of a material having a lower resistivity, then it would be possible to make the gate wiring thinner and longer accordingly. This leads to panels of large area. Conventional materials for gate electrode wiring are Al, Ta, and Ti. Of these, aluminum is most common because of its low resistivity and capability of anodic oxidation. Aluminum forms anodic oxidized film which contributes to heat resistance but suffers whiskers and hillocks, wiring deformation, and diffusion into the insulating film and active layer even at low process temperatures of 300-400° C. This is the major cause to deteriorate TFT's action and characteristic properties.

What is necessary for larger panels and finer pixels is an electrode structure which has a lower resistivity and better heat resistance.

Properties currently required of TFT are high mobility. It is expected that this requirement would be met if crystalline semiconductor film, which has higher mobility than amorphous semiconductor film, is used as the active layer. In the past, it was necessary to use a quartz substrate having a high strain point in order to obtain a crystalline semiconductor film by heat treatment. Attempts have been made to reduce the crystallization temperature so that expensive quartz substrates are replaced by cheap glass substrates.

Accordingly, the present inventors developed a technology to produce a crystallized semiconductor film from an amorphous semiconductor film (typically that of amorphous silicon film or Ge-containing amorphous silicon film) by introduction of a small amount of metal element and subsequent heat treatment. (Japanese Patent Laid-open No.6-232059 and 7-321339) Examples of the metal element to promote crystallization include Fe, Co, Ni, Ru, Rh, Pd, Os, Ir, Pt, Cu, and Au. They may be used alone or in combination with another. This technology enables the production of crystalline semiconductor film at a process temperature low enough for the glass substrate to withstand. Other metals that can be used include Ge and Pb, which undergo substitutional diffusion into amorphous semiconductor film.

The disadvantage of this technology is that the metal used for crystallization remains in the crystalline semiconductor film, producing an adverse effect on TFT's characteristic properties (particularly, reliability and uniformity). So, the present inventors further developed a technology to form wiring from aluminum and subsequently remove the metal elements from the crystalline semiconductor film by gettering. (Japanese Patent Laid-open No.8-330602) According to this technology, gettering is accomplished by performing heat treatment while using the phosphorus-doped source region and drain region as the gettering sink so that the catalyst elements in the channel forming region are captured in the source region and drain region.

However, the above-mentioned technology has the disadvantage of being limited in the temperature range for heat treatment (about 300-450° C.) because wiring is made of aluminum with low heat resistance. For satisfactory gettering, heat treatment at 400° C. and above, preferably 550° C. and above, is necessary.

SUMMARY OF THE INVENTION

It is an object of the present invention to provide a semiconductor device with a new electrode structure which has a low resistivity and withstands gettering satisfactorily. It is another object of the present invention to provide a process for producing said semiconductor device.

The first aspect of the present invention is a semiconductor device equipped with semiconductor circuits composed of semiconductor elements, wherein said semiconductor element comprises:

a substrate with an insulating surface, a gate electrode of multi-layer structure over said substrate, a protective film covering said substrate and the top and sides of said gate electrode, a gate insulating film covering said protective film, and a source region, a drain region, and a channel forming region (between said source region and said drain region) which are formed on said gate insulating film.

In the above-mentioned construction, the gate electrode of multi-layer structure has at least one layer whose principal component is at least one kind of element selected from tantalum, molybdenum, titanium, chromium, and silicon.

In the above-mentioned construction, the gate electrode of multi-layer structure is composed of three layers arranged on top of another, with a first layer being composed mainly of tantalum and containing nitrogen, a second layer being composed mainly of tantalum, and a third layer being composed mainly of tantalum and containing nitrogen, the first layer being adjacent to the substrate.

The second aspect of the present invention is a semiconductor device equipped with semiconductor circuits composed of semiconductor elements, wherein said semiconductor element comprises:
a substrate with an insulating surface,
a gate electrode over said substrate,
a protective film covering said substrate and the top and sides of said gate electrode,
a gate insulating film covering said protective film,
a source region, a drain region, and a channel forming region (between said source region and said drain region) which are formed on said gate insulating film,
an inorganic insulator in contact with said channel forming region, and
an organic resin film in contact with said source region and drain region.

In the above-mentioned second construction, the gate electrode is of three-layer structure, with a first layer being composed mainly of tantalum and containing nitrogen, a second layer being composed mainly of tantalum, and a third layer being composed mainly of tantalum and containing nitrogen.

In each of the above-mentioned constructions, the protective film is a silicon nitride film and has a film thickness of 10-100 nm.

In each of the above-mentioned constructions, the source region and drain region are at least partly silicide.

In each of the above-mentioned constructions, the source region and drain region are incorporated with an impurity to impart the n-type conductivity.

In each of the above-mentioned constructions, the source region and drain region are incorporated with an impurity to impart the n-type conductivity and an impurity to impart the p-type conductivity.

In each of the above-mentioned constructions, the channel forming region contains a catalyst element to promote crystallization of silicon, with the concentration of said catalyst element being higher in the source region and drain region than in the channel forming region.

In each of the above-mentioned constructions, the catalyst element is at least one member selected from Ni, Fe, Co, Pt, Cu, Au, and Ge.

The third aspect of the present invention is a process for producing a semiconductor device equipped with semiconductor circuits composed of semiconductor elements, wherein said process comprises:.
a step of forming wiring over a substrate with an insulating surface,
a step of forming a protective film that covers said wiring,
a step of forming a gate insulating film on said protective film,
a step of forming on said gate insulating film a crystalline semiconductor film containing a catalyst element to promote crystallization of silicon,
a step of irradiating said crystalline semiconductor film with a laser light,
a step of forming a mask of insulating film on part of said crystalline semiconductor film,
a step of doping with phosphorus the region which is to become the source region or drain region,
a step of performing heat treatment for gettering of said catalyst element, and
a step of patterning said crystalline semiconductor film, thereby forming an active layer.

The fourth aspect of the present invention is a process for producing a semiconductor device equipped with semiconductor circuits composed of semiconductor elements, wherein said process comprises:
a step of forming wiring over a substrate with an insulating surface,
a step of forming a protective film that covers said wiring,
a step of forming a gate insulating film on said protective film,
a step of forming on said gate insulating film a crystalline semiconductor film containing a catalyst element to promote crystallization of silicon,
a step of patterning said crystalline semiconductor film, thereby forming an active layer,
a step of irradiating said crystalline semiconductor film with a laser light,
a step of forming a mask of insulating film on part of said crystalline semiconductor film,
a step of doping with phosphorus the region which is to become the source region or drain region,
a step of performing heat treatment for gettering of said catalyst element.

A process for producing a semiconductor device equipped with semiconductor circuits composed of semiconductor elements as defined in the above-mentioned third or fourth construction, wherein the step of forming wiring on a substrate with an insulating surface includes the substeps of forming continuously a first tantalum layer containing nitrogen, a second tantalum layer, and a third tantalum layer containing nitrogen (on top of another, with the first layer being adjacent to the substrate), and performing patterning.

In the above-mentioned third or fourth construction, the step of forming a crystalline semiconductor film on a gate insulating film consists of the substeps of forming an amorphous semiconductor film in contact with the surface of said gate insulating film, causing the amorphous semiconductor film to hold a catalyst element to promote crystallization of silicon, and performing heat treatment, thereby crystallizing the amorphous semiconductor film and forming a crystalline semiconductor film.

In the above-mentioned third or fourth construction, the step of forming a crystalline semiconductor film on a gate insulating film consists of the substeps of forming an amorphous semiconductor film in contact with the surface of said gate insulating film, causing the amorphous semiconductor film to hold a catalyst element to promote crystallization of silicon, and irradiating a laser light, thereby crystallizing the amorphous semiconductor film and forming a crystalline semiconductor film.

BRIEF DESCRIPTION OF THE DRAWINGS

FIGS. 3A-3D are sectional views showing one example of the process for fabrication according to the present invention (Example 1).

FIGS. 4A-4C are sectional views showing one example of the process for fabrication according to the present invention (Example 1).

FIGS. 5A-5C are sectional views showing one example of the process for fabrication according to the present invention (Example 1).

FIGS. 6A-6B are sectional views showing one example of the process for fabrication according to the present invention (Example 1).

FIGS. 8A-8C are sectional views showing one example of the process for fabrication according to the present invention (Example 2).

DESCRIPTION OF THE PREFERRED EMBODIMENTS

Figure 1:
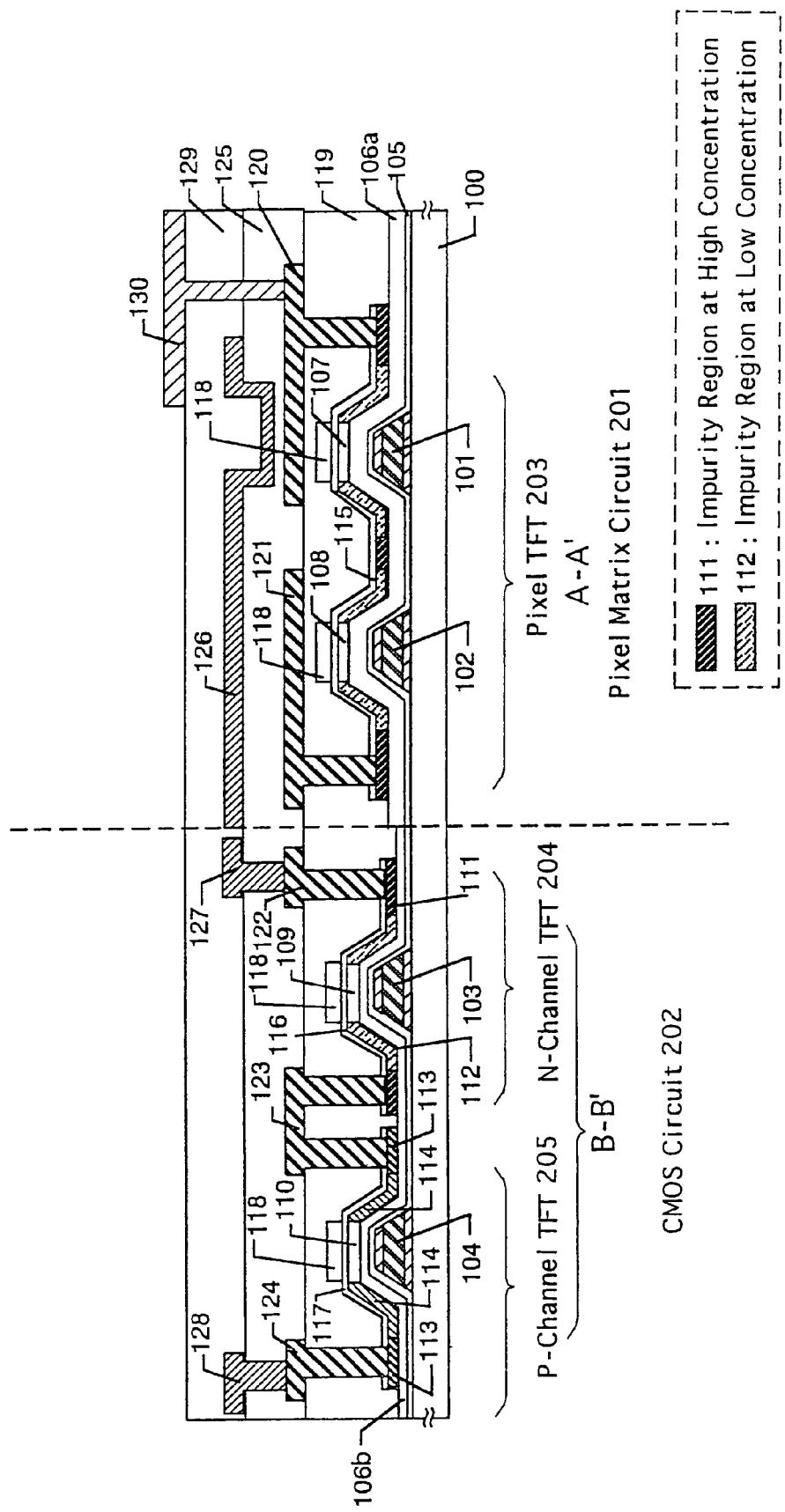
FIG. 1 is a sectional view showing one example of the structure according to the present invention (Example 1).

According to the present invention, the gate wiring and the gate electrode are made of tantalum or a material composed mainly of tantalum. Tantalum is one of the desirable materials because it has a work function close to that of silicon and hence it shifts the threshold value of TFT only slightly.

It is known that tantalum has two kinds of crystal structure (or body-centered cubic structure [α-Ta] and tetragonal lattice structure [β-Ta]). Thin film of tetragonal lattice structure [β-Ta] has a resistivity of about 170-200 μΩ·cm, and thin film of body-centered cubic structure [α-Ta] has a resistivity of about 13-15 μΩ·cm. It is known that tantalum thin film usually takes on the β-Ta structure but it also takes on the α-Ta structure (also called bcc-Ta) if it is incorporated with a trace amount of impurity such as nitrogen.

According to the present invention, TaN film and Ta film are formed consecutively (or laminated on top of the other) so as to obtain the α-Ta structure. In this case, the TaN film should be thicker than 30 nm, preferably thicker than 40 nm, depending on the constituent of the TaN film.

Unfortunately, tantalum or a material composed mainly of tantalum is liable to occlude hydrogen and become oxidized. Hence, when formed into film, it changes in quality (or increases in resistance) due to oxidation and hydrogen occlusion.

In order to address this problem, the present invention employs the gate wiring and the gate electrode of three-layer structure, in which a TaN film (thickness of 30 nm or more, preferably 40 nm or more), a Ta film, and a TaN film are formed (laminated) consecutively on top of another. The three-layer structure is covered with a protective film after patterning.

The consecutively formed three-layer structure in combination with the protective film prevents hydrogen occlusion and oxidation.

The tantalum multi-layer structure (TaN/Ta/TaN=50/250/50 nm) changes in resistance after heat treatment at 450° C., 500° C., 550° C., and 600° C. for 2 hours, as shown in Table 1. The heat treatment was carried out as follows. The temperature was raised from 400° C. to the treating temperature minus 10° C. at a rate of 9.9° C./min and then further raised to the treating temperature at a rate of 5° C./min, and the treating temperature was kept for 2 hours. After gradual cooling, the resistance was measured.

TABLE 1

| Conditions of heat treatment | Resistance before heat treatment | Resistance after heat treatment | Film thickness after heat treatment |
|---|---|---|---|
| 450° C. for 2 hours | 17.5 kΩ | 25 kΩ | 400 nm |
| 500° C. for 2 hours | 10.5 kΩ | 50 kΩ | 530 nm |
| 550° C. for 2 hours | 19 kΩ | ∞ | 700 nm |
| 600° C. for 2 hours | 10.5 kΩ | ∞ | 1000 nm |

It is noted from Table 1 that the tantalum multi-layer film increases in resistance and film thickness with increasing temperature due to deterioration (oxidation).

The tantalum multi-layer structure (TaN/Ta/TaN) coated with a protective film (SiN, 25 nm thick) changes in resistance after heat treatment at 450° C., 500° C., 550° C., and 600° C. for 2 hours, as shown in Table 2. The heat treatment was accomplished in the same way as in the case of Table 1.

TABLE 2

| Conditions of heat treatment | Resistance before heat treatment | Resistance after heat treatment | Film thickness after heat treatment |
|---|---|---|---|
| 450° C. for 2 hours | 21.3 kΩ | 19.1 kΩ | 350 nm |
| 500° C. for 2 hours | 19.8 kΩ | 19.0 kΩ | 350 nm |
| 550° C. for 2 hours | 10.3 kΩ | 11.7 kΩ | 360 nm |
| 600° C. for 2 hours | 50 kΩ | 40 kΩ | 340 nm |

It is noted from Table 2 that the protective film (SiN) prevents the tantalum multi-layer film from increasing in resistance and film thickness after heat treatment.

The foregoing indicates that heat treatment at high temperatures (400-700° C.) is possible if a tantalum film or a tantalum-based film (which has good heat resistance) is used for the wiring and the wiring is coated with a protective film. Such heat treatment permits the gettering of metallic elements in a crystalline semiconductor film. The gate wiring (with a wiring width of 0.1-5 μm) withstands such heat treatment at specific temperatures without being oxidized and hence retains its low resistance because it is coated with a protective film.

The content of nitrogen in the TaN film ranges from 5 to 60%, depending on the sputtering apparatus and conditions. Incidentally, it is desirable to obtain the α-Ta film by using argon or xenon plasma.

Moreover, tantalum may be replaced by Mo, Ti, Nb, W, Mo—Ta alloy, Nb—Ta alloy, W—Ta alloy, or the like. These materials may be used in the form of nitrogen-containing metal or silicide (which is a metallic compound with silicon).

According to the present invention, the protective film may be an inorganic insulating film (such as silicon nitride film and silicon nitride oxide film) in a single layer or multiple layers. The thickness of the protective film ranges from 10 to 100 nm. In addition, the protective film may be amorphous silicon film or crystalline silicon film.

Since TaN film is less liable to hydrogen occlusion and oxidation than Ta film, it is used as the uppermost layer to cover tantalum layer so as to ensure good ohmic contact when contact holes are formed.

Figure 11:
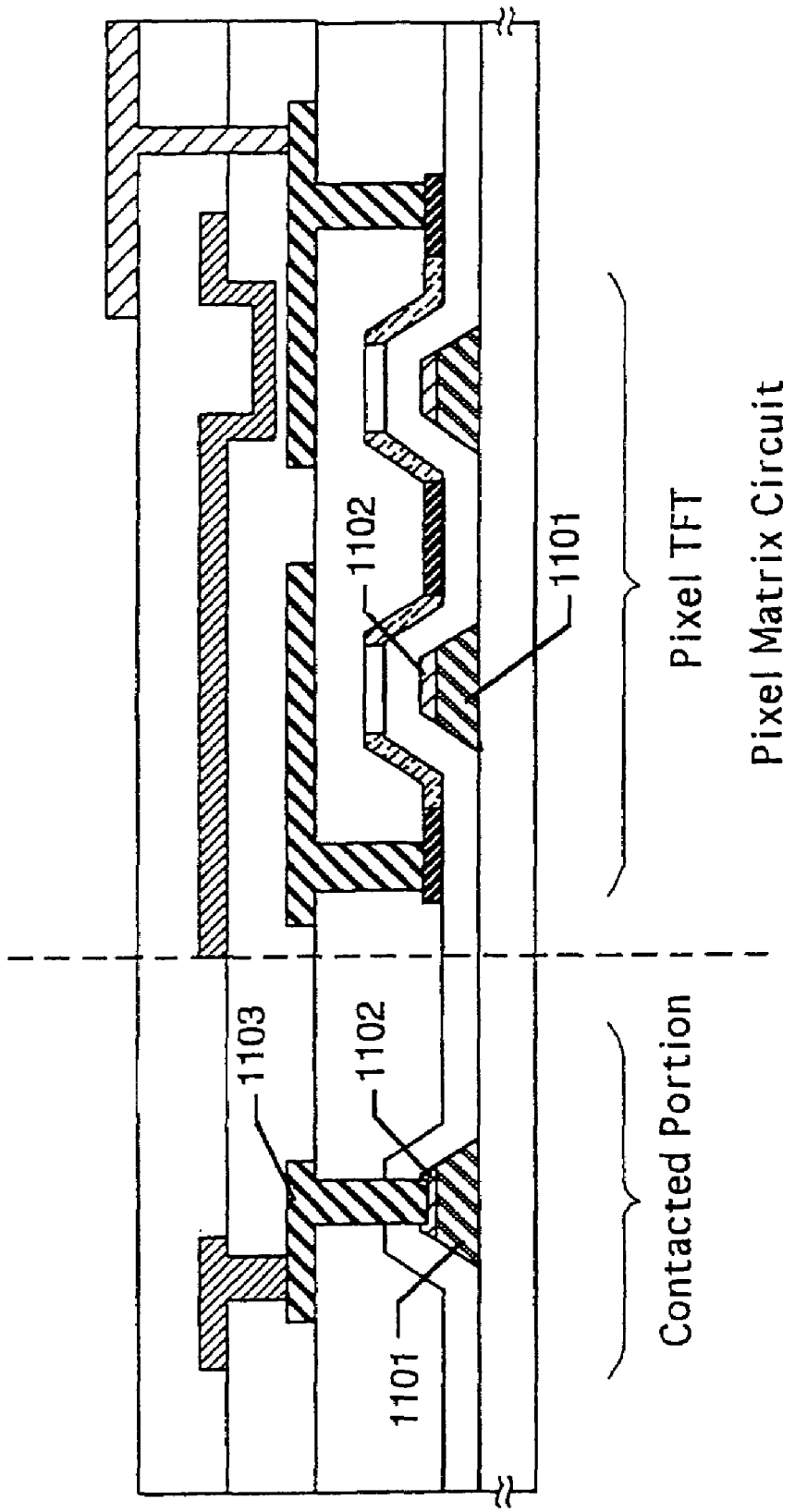
FIG. 11 is a sectional view showing one example of the structure according to the present invention (Example 6).

Another desirable structure to give good ohmic contact for wiring connection is a multi-layer wiring composed of a tantalum-based layer 1101 and a titanium-based layer 1102 laminated thereon, as shown in FIG. 11. This titanium-based layer 1102 protects the tantalum-based layer 1101 from oxidation and hydrogen occlusion when contact holes are made.

The titanium-based layer also provides good ohmic contact because it does not become an insulator when exposed and oxidized and it is easily removed. In other words, the titanium-based layer protects the tantalum-based layer and also facilitates the formation of contact holes (openings) because it provides sufficient margin for etching.

High-heat-resistant tantalum film or tantalum-based film used for wiring permits heat treatment at high temperatures (400-700° C.) for the gettering of metallic elements in crystalline semiconductor film. During high-temperature heat treatment, the protective film prevents the diffusion of impurities from the substrate due to heating, thereby permitting the gate insulating film to retain good insulating properties. The result is that TFTs having good characteristic properties can be produced without being affected by the concentrations of impurities contained in the substrate.

Thus, the semiconductor device according to the present invention has a lower resistivity than conventional ones (with tantalum film of β-Ta). The process of the present invention enables the production of good TFTs regardless of the concentration of impurities in the substrate even when heat treatment is carried out at high temperatures (400-700° C.).

The invention will be explained with reference to the following examples, which are not intended to restrict the scope thereof.

EXAMPLE 1

A semiconductor device according to the present invention is constructed as shown in FIG. 1. It has peripheral driving circuits and pixel matrix circuits on the same substrate. For easy illustration, there are shown in FIG. 1 a CMOS circuit 202 constituting part of the peripheral driving circuits and a pixel TFT 203 (n-channel type TFT) constituting part of the pixel matrix circuits.

Figure 2A:
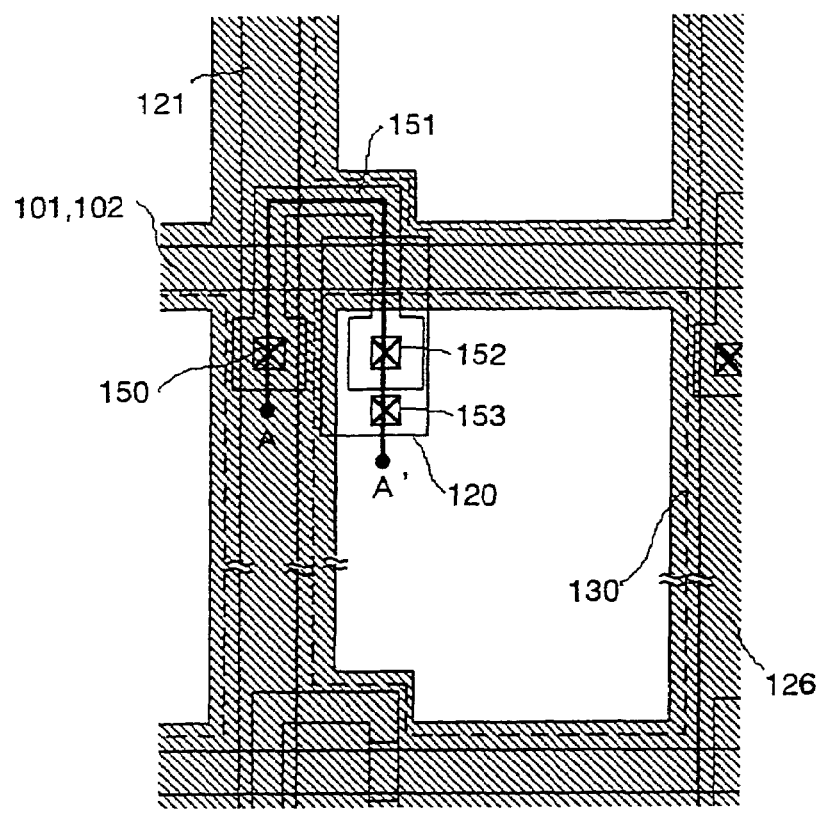
FIGS. 2A-2B are top views showing one example of the structure according to the present invention (Example 1).
Figure 2B:
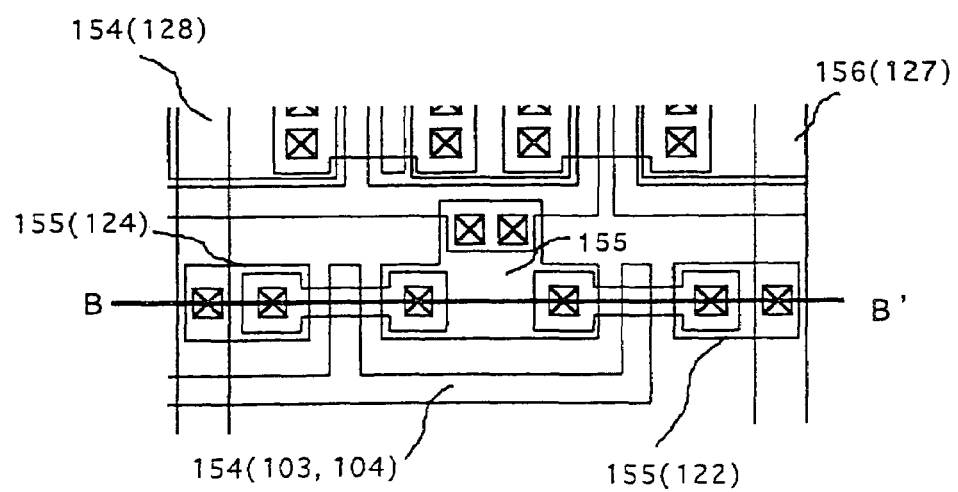

FIG. 2 is a top view corresponding to FIG. 1. The section taken along the thick line A-A' represents the structure of the pixel matrix circuit 201 in FIG. 1 and the section taken along the thick line B-B' represents the structure of the CMOS circuit 202 in FIG. 1.

In each of thin-film transistors (TFTs) 203-205, gate electrodes 101-104 are formed on a substrate 100 according to a prescribed pattern. To be more specific, gate electrodes 101-104 are formed on an underlying film (not shown) and are of multi-layer structure (TaN film [50 nm thick]/Ta film [250 nm thick]/TaN film [50 nm thick]) to prevent the increase of resistance. The substrate and the gate electrodes are covered with an inorganic protective film 105. On this protective film is formed a gate insulating film 106a or 106b. On this gate insulating film are formed active layers 107-114 of crystalline semiconductor film. On the active layer are formed thin oxide films 115-117 by irradiation with a laser light in an oxidizing atmosphere.

In the case of p-channel type TFT 205 for CMOS circuit, the active layer consists of a $p^+$-type region 113 (source region or drain region) with a high impurity concentration, a channel forming region 110, and a $p^+$-type region 114 with a low impurity concentration which is formed between the above-mentioned two regions. On the channel forming region is formed an etching stopper 118. The above-mentioned layers are covered with a first interlayer insulating film 119 (which is flat). In this interlayer insulating film 119 are formed contact holes for wiring 124 connected to the region 113 with a high concentration of impurity. On the first interlayer insulating film is formed a second interlayer insulating film 125. Wiring 124 is connected to wiring 128. On the second interlayer insulating film is formed a third interlayer insulating film 129.

On the other hand, the active layer in the n-channel type TFT 204 consists of an $n^+$-type region 111 with a high impurity concentration, a channel forming region 109, and an $n^+$-type region 112 with a low impurity concentration which is formed between the above-mentioned two regions. In any active layer, the region with a high impurity concentration functions as the source region or drain region. To the source region and drain region are connected wiring 122 and 123. Other part than the active layer has the same structure as in the p-channel type TFT.

The n-channel type TFT 203 in the pixel matrix circuit 201 is formed in the same manner as the n-channel type TFT in the CMOS circuit until the first interlayer insulting flat film 119 is formed. Finally, the wiring 121 is connected to the source region and the wiring 120 is connected to the drain region. On them are formed a second interlayer insulating film 125 and the black mask 126. The black mask 126 covers the pixel TFT to form the auxiliary capacity in conjunction with the wiring 120. On it is formed a third interlayer insulating film 129, and a pixel electrode 130 (which is a transparent electrically conductive film of ITO or the like) is connected.

The semiconductor device shown in FIG. 1 is produced by the process which is detailed below with reference to FIG. 3.

First, a substrate 100 having an insulating surface is made ready. The substrate may be of glass, quartz, ceramics, or semiconductor. In this example, a quartz substrate was used as the substrate 100. In order to ensure flatness, it is desirable to coat the substrate with an underlying film (of silicon oxide, silicon nitride, or silicon nitride oxide). The underlying film prevents peeling due to strain by the substrate and the gate wiring material under stress.

Then, the gate wiring and the gate electrode are formed in laminate structure. In this example, a tantalum nitride (TaN) film, a tantalum (Ta) film, and a tantalum nitride (TaN) film are consecutively formed by sputtering on the insulating film. After patterning, the gate electrode of three-layer structure is formed. (FIG. 3(A))

In this example, the TaN film (which should preferably be thicker than 40 nm) is consecutively laminated with the Ta film so as to form low-resistance α-Ta.

Since the Ta film is more subject to oxidation and hydrogen occlusion than the TaN film, the following layer structure (as shown in FIG. 3(A)) is adopted to prevent it from increasing in resistance.

TaN [101a, 102a, 103a, 014a; 50 nm thick]/Ta[101b, 102b, 103b, 104b; 250 nm thick]/TaN[101c, 102c, 103c, 104c; 50 nm thick]

The TaN layer as the uppermost layer is intended to protect the Ta film from being exposed for oxidation and hydrogen occlusion, thereby providing good ohmic contact, when contacts with other wiring are made. Also, forming a TiN film as the uppermost layer is desirable because it forms no insulator even though it becomes oxidized.

Tantalum as the wiring material may be replaced by Mo, Nb, W, Mo—Ta alloy, Nb—Ta alloy, W—Ta alloy, or the like. Moreover, these materials may be used in the form of nitrogen-containing metal or silicide (which is a metallic compound with silicon).

A protective film 105 of silicon nitride is formed such that it covers the gate electrode. This inorganic protective film protects the tantalum film in the gate electrode from oxidation and hydrogen occlusion. In addition, the protective film prevents the diffusion of impurity from the substrate by heating, thereby keeping the gate insulating film with good insulating properties, when high-temperature treatment (such as gettering) is performed. Further, the protective film 105 protects the gate electrode and wiring from laser light and heat. The thickness of the protective film ranges from 10 to 100 nm; in this example, it is 20 nm. (FIG. 3(B))

Gate insulating films 106a and 106b are formed such that they cover the protective film. In this example, the insulating film 106a is 125 nm thick and the insulating film 106b is 75 nm thick, and they are made of silicon oxide nitride (SiOxNy). The gate insulating film is formed such that the region to become the gate insulating film for high voltage circuits is selectively made thicker than the gate insulating film for high-speed driving circuits. The resulting structure withstands high voltages. The insulating films with different thickness may be formed by any known method. This is accomplished by, for example, forming an insulating film (75 nm thick) over the entire surface and then selectively laminating another insulating film (50 nm thick) thereon. The insulating films 106a and 106b may be of silicon oxide, silicon nitride, or silicon oxide nitride, or in the form of their laminate, with the film thickness being 50-300 nm.

On the gate insulating film is laminated an amorphous semiconductor film so as to form an active layer on the insulating films 106a and 106b. It is desirable to form the protective film 105, the insulating film 106, and the amorphous semiconductor film consecutively so as to reduce impurities and to increase throughput. The active layer should be a crystalline semiconductor film (typically, a crystalline silicon film), 20-100 nm thick, preferably 25-70 nm thick. The crystalline semiconductor film may be formed by any known method, such as laser crystallization or thermal crystallization. In this example, a catalyst element (nickel) is added to promote crystallization. This technology is disclosed in Japanese Patent Laid-open No.7-130652 and 9-312260.

In this example, an amorphous silicon film (55 nm thick) is formed by reduced pressure CVD method. Then, a solution of Ni acetic acid is applied by using a spinner. Upon drying, there is obtained a Ni layer 302. (FIG. 3(C)) The Ni layer is not in the form of complete layer. The concentration of Ni in the Ni acetate should be 1-1000 ppm. In this example, this concentration is 100 ppm. In this state, Ni is held on the surface of the amorphous silicon film. Upon heating at 550° C. for 8 hours in an inert or oxidizing atmosphere, there is obtained a crystalline silicon film. (FIG. 3(D))

The crystalline silicon film is irradiated with a laser light in an oxidizing atmosphere for laser annealing and oxidation to form a thin oxide film 401. (FIG. 4(A)) This thin oxide film contributes to adhesion between the crystalline silicon film and a resist or etching stopper to be formed later. However, this oxide film is not obtained if laser irradiation is carried out in an inert atmosphere.

A silicon oxide film (120 nm thick) is formed, and it is patterned to form an etching stopper 118. A doping mask 402 of resin is formed. Incidentally, the etching stopper 118 may also be formed from amorphous silicon film, crystalline silicon film, silicon nitride film, or silicon oxide nitride film.

The first doping with phosphorus is carried out by non-self-alignment process employing the resist 402 as a mask. (FIG. 4(B)) In this example, phosphorus is added into the N+ region indicated by 403 such that the concentration is $1\times10^{20}$-$8\times10^{21}$ atoms/cm$^3$.

The resist mask 402 is removed. The second doping with phosphorus is carried out by using the etching stopper 118 as a mask. (FIG. 4(C)) In this example, this doping is carried out such that the concentration is $1\times10^{15}$-$1\times10^{17}$ atoms/cm$^3$ in the N-region 406. In an n-channel type TFT, the n+-type region 407 becomes the source region or drain region and the N− region becomes the region 406 with low impurity concentration.

Then, the n-channel type TFTs 203 and 204 are covered with a resist 501. Boron is added to the active layer of the p-channel type TFT so as to form the p-type region 502 (in which phosphorus exists in high concentrations) and the p-type region 503 (in which phosphorus exists in low concentration). (FIG. 5(A)) The dose of boron is such that the concentration of boron in p-type region is about 1.3-2 times the concentration of phosphorus ions added to the n+-type region. Incidentally, in this example, any known method may be used to add phosphorus ions or boron ions. It includes ion implantation, plasma doping, application of a solution containing phosphorus ions or boron ions, followed by heating, and forming a film containing phosphorus ions or boron ions, followed by heating.

The p-type regions 502 and 503 become the source region or drain region of the p-channel type TFT. The region in which phosphorus ions or boron ions have not been injected becomes the intrinsic (or substantially intrinsic) channel forming region which subsequently serves as the carrier moving path.

Incidentally, in this specification, the "intrinsic region" means a region which does not contain any impurity at all which changes the Fermi level of silicon, and the "substantially intrinsic region" means a region in which electrons and holes are completely balanced to cancel the conductivity type, that is, a region which contains an impurity to impart the n-type or p-type in concentrations ($1\times10^{15}$-$1\times10^{17}$ atoms/cm$^3$) to permit control of the threshold value or a region in which the conductivity type is cancelled by intentionally adding a reverse conducting type impurity.

Then, heat treatment is carried out at 450° C. or above for 0.5-12 hours (at 550° C. for 2 hours in this example) in an inert atmosphere or dry oxidizing atmosphere. (FIG. 5(B))

This heat treatment causes Ni (which has been intentionally added to crystallize the amorphous silicon film) to diffuse from the channel forming region to the source region and drain region as schematically indicated by arrows in FIG. 5(B). Upon arrival at the source region and drain region, Ni is captured there (for gettering). Heat treatment at 400-600° C. for 0.5-4 hours is enough for Ni gettering.

As the result, it is possible to reduce the Ni concentration in the channel forming region 110. The Ni concentration in the channel forming regions 107-110 may be reduced below $5\times10^{17}$ atoms/cm$^3$, which is the detection limit of SIMS. On the other hand, the Ni concentration in the source region and drain region which have been used as the gettering sink becomes higher than that in the channel forming region. (FIG. 5(C))

An impurity to impart the n-type conductivity includes phosphorus as well as antimony and bismuth. Phosphorous is most capable of gettering, and antimony comes next.

It has been experimentally confirmed that the region 505 in which the boron concentration is about 1.3-2 times higher than the phosphorus concentration because of the addition of both phosphorus and boron is more capable of gettering than the source region and drain region 504 of n-channel type TFT to which only phosphorus has been added.

Further, this heat treatment not only performs gettering but also activates phosphorus and boron added to the source region and drain region and to the region of low impurity concentration. In the past, it was only possible to heat up to about 450° C. because the wiring material (aluminum) is poor in heat resistance. In this example, however, it is possible to sufficiently activate the dopant only by heat treatment at 500° C. or above, thereby reducing resistance in the source region and drain region.

In addition, this heat treatment recovers crystallinity in the region in which crystallinity has been destroyed by ion doping.

In other words, the heat treatment in an oxidizing atmosphere in FIG. 5(B) permits simultaneously
1) gettering to reduce the concentration of catalyst element in the channel forming regions 107-110;
2) activation of impurity in the source regions and drain regions 504 and 505; and
3) annealing to recover the damage to crystal structure that has occurred during ion implantation.

In addition, the heat treatment may be accompanied simultaneously by or followed by or preceded by laser annealing, infrared light annealing, or UV light annealing.

Then, the active layer is patterned into a desired shape, as shown in FIG. 6(A).

After that, the region 111 of high impurity concentration is reduced in resistance. For this purpose, a metal film is formed on the active layer to make it selectively into silicide and the metal film is heated so that the region indicated by 111 is made into silicide. This step reduces the resistance to such an extent the resulting semiconductor device operates at high frequencies of the order of GHz. The metal film to make silicide may be the one which is composed mainly of cobalt, titanium, tantalum, tungsten, and molybdenum. Incidentally, in order to make silicide effectively, it is desirable to remove the thin oxide films 115-117 on the region of high impurity concentration before the metal film is formed. Alternatively, it is desirable to remove the etching stopper 118.

Then, a first interlayer insulating film 119 is formed from a transparent organic resin (acrylic resin) over the entire surface of the substrate. In this example, a first interlayer insulating film 119 (1 µm thick) is formed by spin coating. It has a flat surface as shown if it is made of a transparent resin such as acrylic resin, polyimide resin, and BCB (benzocyclobutene). It may also be made of silicon oxide or silicon oxide nitride.

Contact holes are formed, and metal film (not shown) is formed which constitutes electrodes for contacts. This metal film is of three-layer structure, composed titanium film, aluminum film, and titanium film, formed by sputtering. This metal film (or laminated film) is patterned to form the electrodes and wirings indicated by 120-124.

A second interlayer insulating film 125 (1 µm thick) of organic resin is formed by spin coating. A desired part is made thin by etching to form the auxiliary capacity. A metal film of Ti (300 nm thick) is formed. This metal film is patterned to form the black mask 126 and the lead wirings 127 and 128.

A third interlayer insulating film 129 (1 µm thick) is formed from an acrylic resin by spin coating. The resulting resin film has a flat surface as shown.

A contact hole is formed, and a pixel electrode 130 is formed. In this example, an ITO film (100 nm thick) is formed, and it is patterned to form the pixel electrode 130.

Finally, heat treatment is carried out at 350° C. for 1 hour in a hydrogen atmosphere so as to reduce defects in the semiconductor layer. The results are shown in FIG. 6(B).

In this example, the pixel TFT 203 for the pixel matrix circuit has the gate electrode of double gate structure. However, the gate electrode may be of multi-gate structure (or triple-gate structure) in order to reduce the fluctuation of off current. Moreover, the gate electrode may be of single-gate structure for large opening.

The TFT structure shown in this example is an example of bottom gate type (etching topper type). The TFT structure is not limited to the one shown in this example. For example, it may be of channel etch type structure. In this example, the production of transmission LCD is demonstrated; however, this is merely an example of semiconductor devices. The ITO pixel electrode may be formed from a highly reflective metal film, and the pixel electrode may be patterned differently so as to produce a reflection LCD. The reflection LCD may have an underlying film of laminate structure composed of heat resistant metal film and insulating film or composed of aluminum nitride film and insulating film. In this case the metal film under the insulating film effectively functions as a heat radiating layer. The sequence of the above-mentioned steps may be changed adequately by those who practice the invention.

EXAMPLE 2

In Example 1, patterning is carried out after the step of laser irradiation (FIG. 6(A)). In this example, however, patterning is carried out before the step of laser irradiation. This is shown in FIG. 7-9. These two examples are the same in base structure; only differences are explained.

Figure 7A:
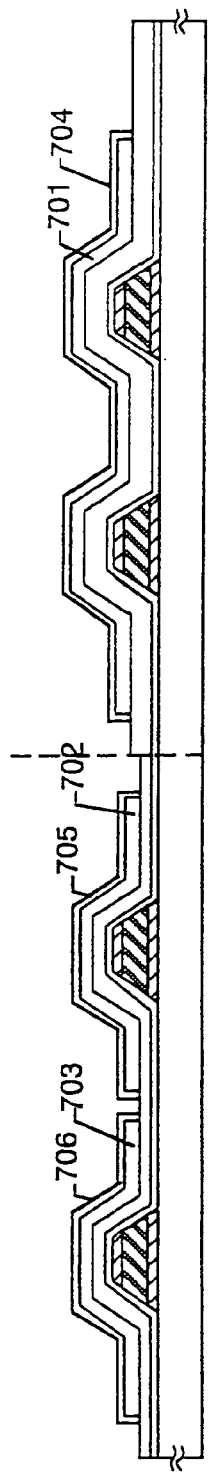
FIGS. 7A-7C are sectional views showing one example of the process for fabrication according to the present invention (Example 2).
Figure 7B:
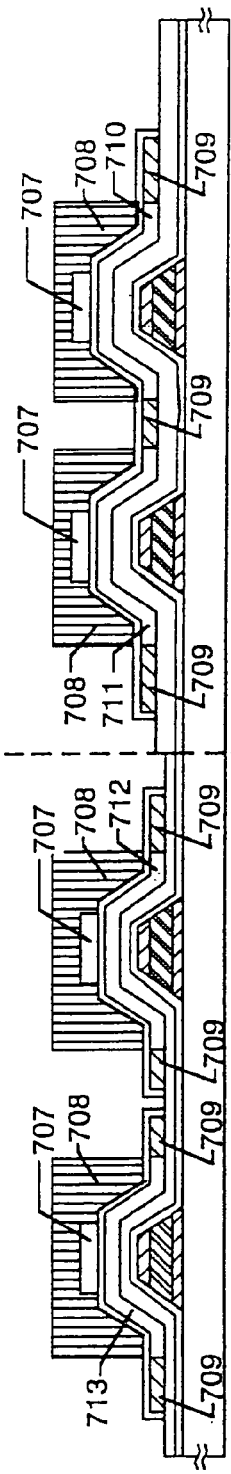
Figure 7C:
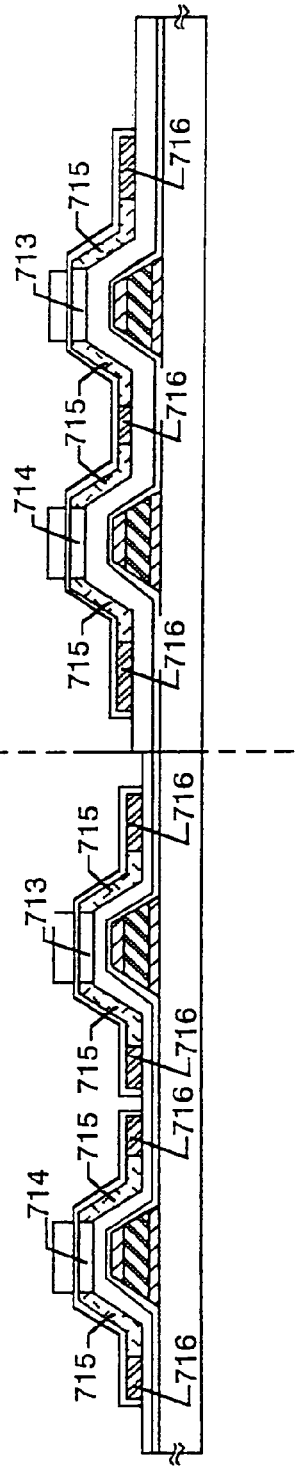

The steps up to the formation of the crystalline semiconductor film are the same as shown in FIG. 3(D) in Example 1; therefore, their explanation is omitted. The intermediate product shown in FIG. 3(D) is patterned according to the desired shape and irradiated with a laser beam in an oxidizing atmosphere to give an intermediate product shown in FIG. 7(A). As shown in FIG. 7(A), the surface of the active layers 701-703 is covered with thin oxide films 704-706.

Subsequent steps are the same as those in Example 1. They are doping with phosphorus in high concentration (FIG. 7(B)), doping with phosphorus in low concentration (FIG. 7(C)), doping with boron (FIG. 8(A)), and gettering (FIG. 8(B)). The intermediate product up to this step is shown in FIG. 8(C).

Figures 9A, 9B:
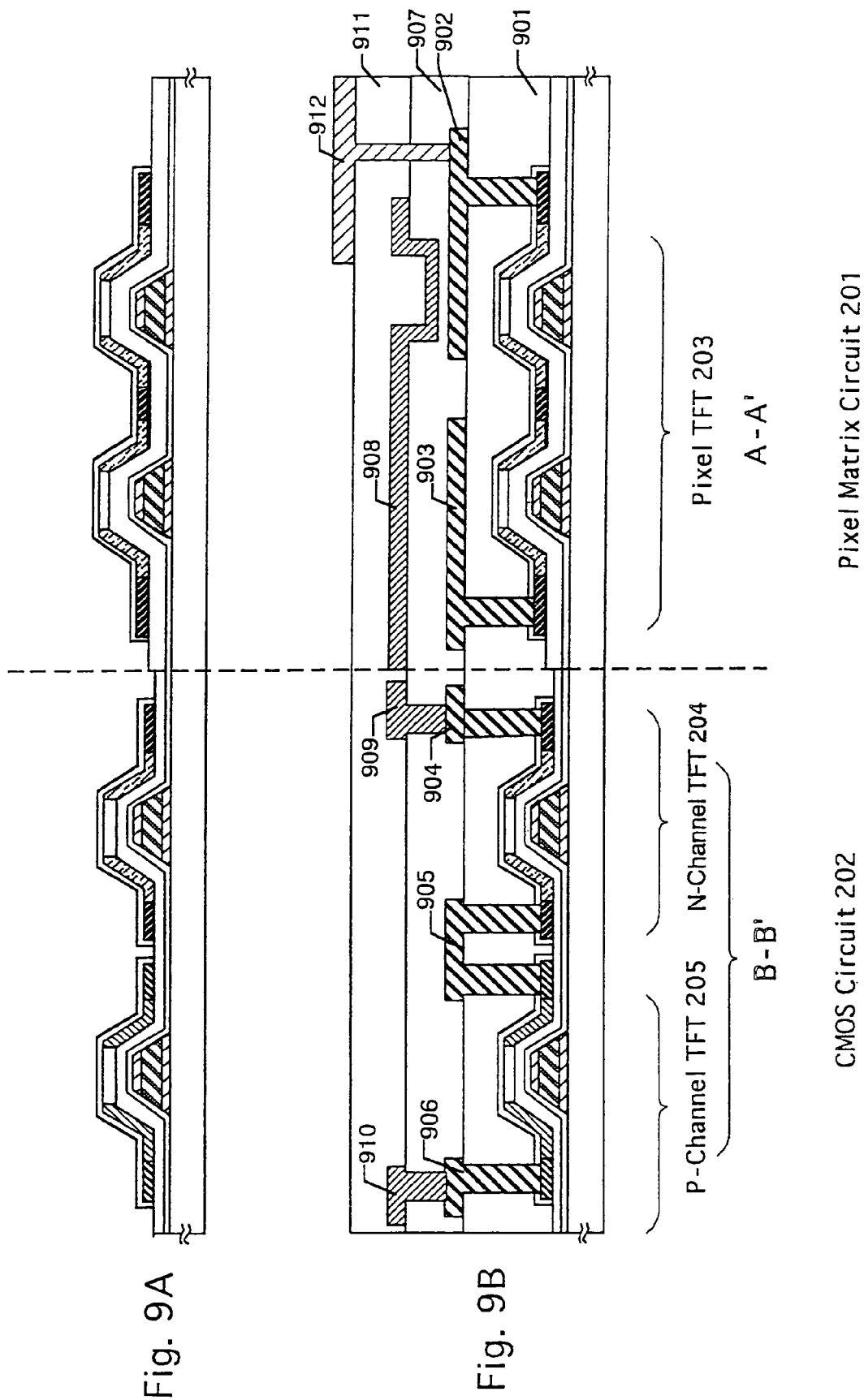
FIGS. 9A-9B are sectional views showing one example of the process for fabrication according to the present invention (Example 2).

The etching stopper 707 placed on the top of the channel forming region is removed, as shown n FIG. 9(A). The step of removing the etching stopper 707 may be omitted.

This step may be preceded or followed by or accompanied simultaneously by the step of removing the thin oxide films 704-706. After the removal of the thin oxide film, it is desirable to form selectively a metal film on the region of high impurity concentration, and this metal film is heated to be made into silicide. In this way it is possible to reduce resistance in the source region and drain region so as to permit operation at high frequencies of the order of GHz. The metal film to be made into silicide may be the one which is composed mainly of cobalt, titanium, tantalum, tungsten, or molybdenum.

The subsequent steps are identical with those in Example 1 and hence their explanation is omitted. Thus there is obtained an intermediate product shown in FIG. 9(B). The advantage of this structure is that the thin oxide films 704-706 protect the active layers 701-703 from impurity which has diffused from the interlayer insulating film.

EXAMPLE 3

Figure 10:
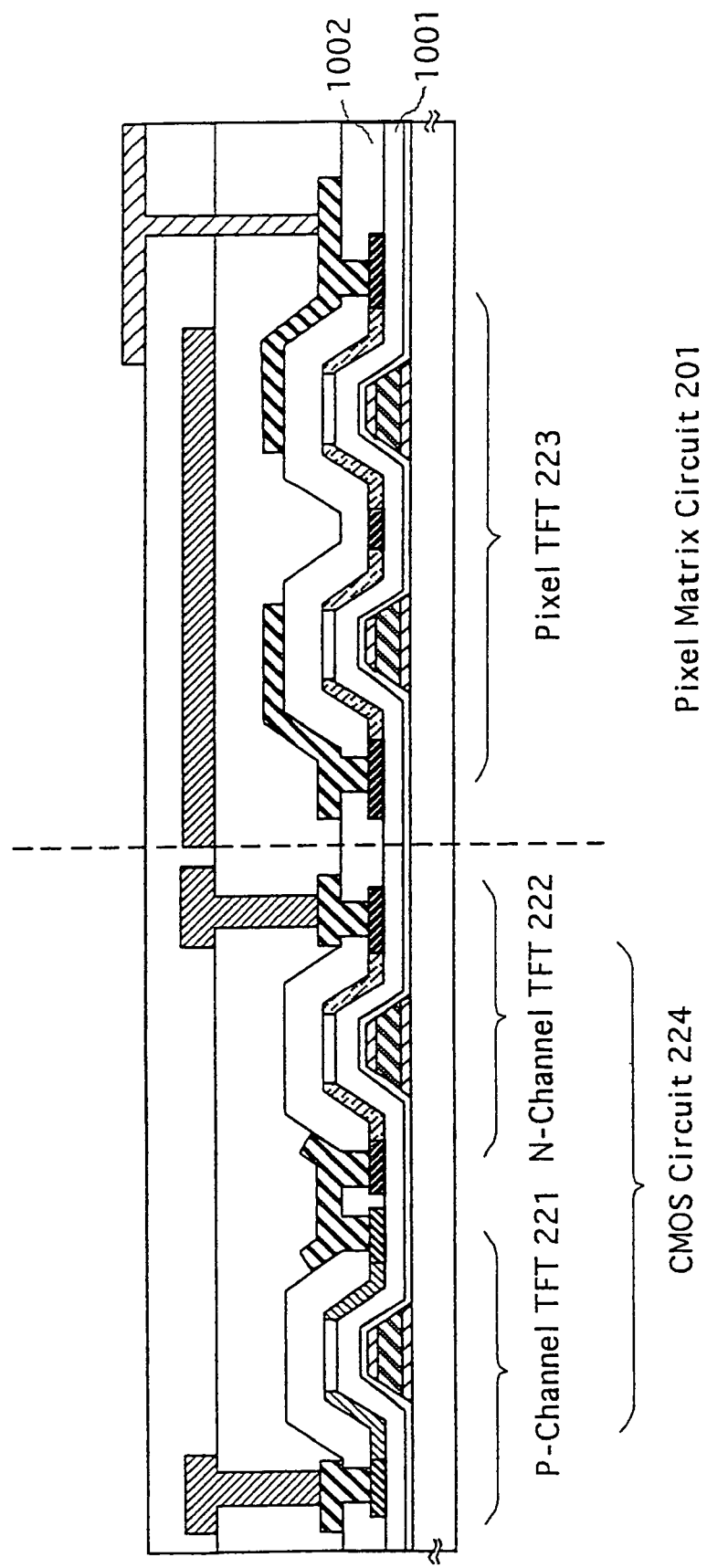
FIG. 10 is a sectional view showing one example of the structure according to the present invention (Example 3).

This example demonstrates a structure which is almost identical with that in Example 1 except for slight differences explained below. The structure in Example 1 is characterized by a difference in thickness between the gate insulating film 106b of CMOS circuit 202 and the gate insulating film 106a of the pixel matrix circuit 201, both circuits constituting part of the peripheral drive circuits. The gate insulating film according to this example is shown in FIG. 10. It has the same thickness as in Example 1.

In this example, the same steps as in Example 1 are repeated until the protective film shown in FIG. 3(B) is formed. Therefore, the explanation of these steps is omitted. After the intermediate product shown in FIG. 3(B) has been obtained as in Example 1, the gate insulating film 1001 and the amorphous semiconductor film are formed consecutively. Then, the active layer consisting of crystalline semiconductor film is patterned by the same process as in Example 1.

Subsequently, the thin oxide film (adjacent to the active layer) and the etching stopper are removed and a metal film is selectively formed on the region of high impurity concentration. The metal film is made into silicide by heat treatment. The resulting source region and drain region have a low resistance which permits operation at high frequencies of the order of GHz. The metal film to make silicide may be the one which is composed mainly of cobalt, titanium, tantalum, tungsten, or molybdenum. After that, an interlayer insulating film 1002 of silicon oxide is formed. By the same subsequent steps as in Example 1, there is obtained the structure as shown in FIG. 10. Incidentally, this example may be combined with Example 2.

EXAMPLE 4

This example demonstrates a process for producing a crystalline semiconductor film in a way different from that in Example 1. The process includes steps of adding catalyst element by using a mask and performing heat treatment. The process is basically identical with that of Example 1 except for some differences explained in the following.

In this example, the same steps as in Example 1 are repeated until the protective film shown in FIG. 3(B) is formed. Therefore, the explanation of these steps is omitted. After the amorphous semiconductor film has been formed, a mask of silicon oxide is formed. This mask has an opening. A catalyst element (Ni) in the form of nickel acetate solution is added to the opening.

The amorphous silicon film is crystallized by heating at 400-700° C. Crystallization proceeds in the direction from the region with an opening to the substrate. This crystal growth is referred to as lateral growth. After that, the mask is removed. The region which has become crystallized by lateral growth is used as the region in which TFT channel is formed. This provides good characteristic properties. According to the present invention, it is possible to carry out heat treatment at 400° C. or above and hence to obtain a crystalline semiconductor film. By the same subsequent steps (FIG. 4(A) and forward) as in Example 1, there is obtained the structure as shown in FIG. 1. Incidentally, this example may be combined with Examples 2 and 3.

EXAMPLE 5

This example demonstrates a process for producing a crystalline semiconductor film in a way different from that in Example 1. In this example, a crystalline semiconductor film is formed by the aid of a catalyst element to promote crystallization of silicon and also by the aid of laser irradiation that employs a square or rectangular laser beam to cover an area of several to hundreds of square centimeters with one shot of irradiation. The process is basically identical with that of Example 1 except for some differences explained in the following.

In this example, the same steps as in Example 1 are repeated until a catalyst element is supported on the surface of the amorphous silicon film as shown in FIG. 3(C). Therefore, the explanation of these steps is omitted. In the step shown in FIG. 3(C), the concentration of nickel in the nickel acetate solution should be 1-1000 ppm. In this example, it is 100 ppm. Nickel is held on the surface of the amorphous silicon film. A crystalline silicon film is formed by irradiation with excimer laser light (wavelength 248-308 nm) in an inert or oxidizing atmosphere.

In this example, a laser apparatus ("SAELC" from Sopla) is used to form the crystalline silicon film. This apparatus evolves a square or rectangular laser beam (wavelength 248 nm) which uniformly covers an area of several to hundreds of square centimeters at one time. By the same subsequent steps (FIG. 4(A) and forward) as in Example 1, there is obtained the structure as shown in FIG. 1. Incidentally, this example may be combined with Examples 2 to 4.

EXAMPLE 6

This example demonstrates the structure to provide good ohmic contact for connection between wirings, with reference to FIG. 11. The pixel matrix circuit is basically the same in structure as that in Example 1, except for some differences explained below.

A substrate with an insulating surface is made ready as in Example 1. An underlying film of silicon oxide (not shown) is formed. A layer 1101 of metal material composed mainly of tantalum and a layer 1102 (20-100 nm thick) of metal material composed mainly of titanium are formed consecutively. Patterning is performed to form a multi-layer wiring. After that, the same procedure as in Example 1 is repeated to form the gate insulating film, active layer, interlayer film, and contact hole.

The layer composed mainly of titanium protects the layer 1101 composed mainly of tantalum from oxidation and hydrogen occlusion when contact holes (openings) are formed. The layer composed mainly of titanium provides good ohmic contacts because it does not form an insulator despite reaction with oxidation, although it may be partly removed together with the interlayer insulating film when openings are formed. In other words, the layer composed mainly of titanium protects the layer composed mainly of tantalum and also facilitates the formation of openings because it permits sufficient margin. Openings are formed, and then wiring 1103 is formed for connection with the multi-layer wiring indicated by 1101 and 1102. After that, the same procedure as in Example 1 is repeated to give the structure shown in FIG. 11.

The layer composed mainly of titanium may be replaced by a layer composed mainly of one element selected from Cr, Mn, Co, Ni, Cu, Mo, and W.

Incidentally, in this example, unlike the structure in Example 1, the etching stopper and thin oxide film are removed and the protective film is not formed. This example may be combined with Examples 2 to 5.

EXAMPLE 7

This example demonstrates an AMLCD which is constructed of a TFT substrate (a substrate on which elements are formed) having the structure shown in Examples 1 to 6. An external appearance of AMLCD is shown in FIG. 12.

Figure 12A:
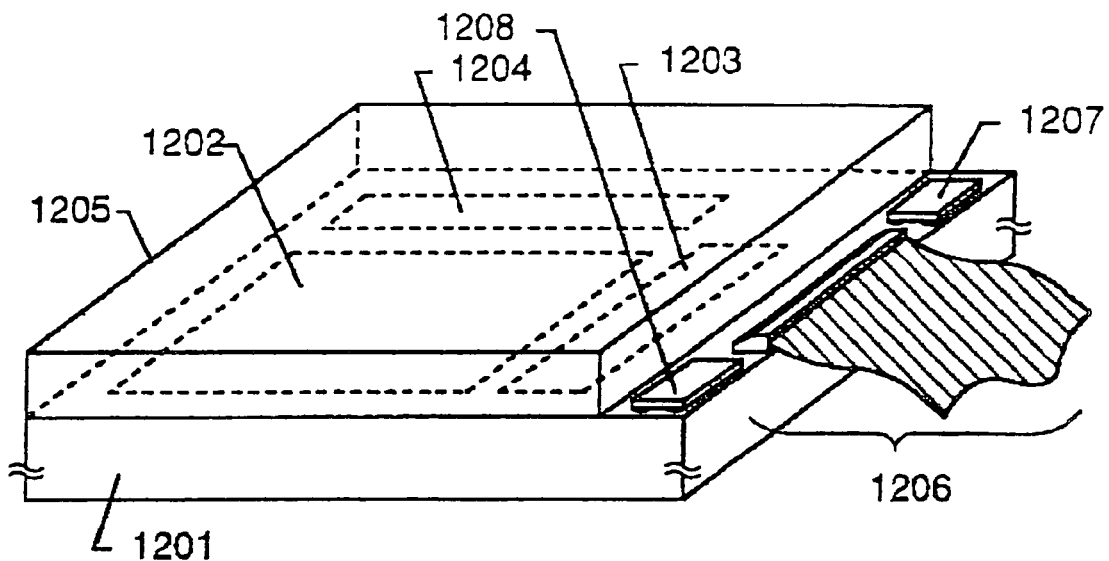
FIGS. 12A-12B are external appearances of AMLCD.

In FIG. 12(A), there is shown a TFT substrate 1201, on which are formed a pixel matrix 1202, a drive circuit 1203 at the source, and a drive circuit 1204 at the gate. The pixel matrix corresponds to FIG. 2(A) and FIG. 1, and a part of it is shown. The drive circuit corresponds to FIG. 2(B) and FIG. 1, and a part of it is shown. It is desirable to constitute CMOS circuit by complimentary combination of n-type TFT and p-type TFT. There is shown an opposite substrate 1205.

The AMLCD shown in FIG. 12(A) consists of the active matrix substrate 1201 and the opposite substrate 1205 bonded together, with their edges aligned. A portion of the opposite substrate 1205 is removed, and the FPC (flexible print circuit) 1206 is connected to the exposed active matrix substrate. This FPC 1206 transmits external signals into the circuit.

The surface to which the FPC 1206 is attached is utilized for the mounting of IC chips 1207 and 1208. These IC chips contain various circuits such as video signal processing circuits, timing pulse generating circuits, γ-correcting circuits, memory circuits, and arithmetic circuits formed on a silicon substrate. One or more IC chips may be used, although two chips are shown in FIG. 12(A).

Figure 12B:
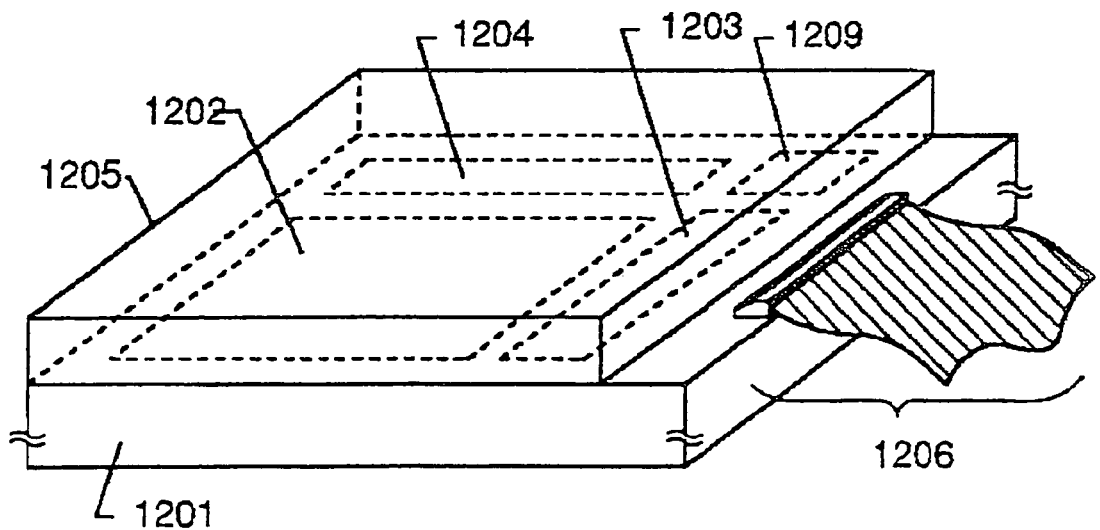

The structure as shown in FIG. 12(B) could also be possible. The same codes are used for the same parts in FIG. 12(B) and FIG. 12(A). In this example, the signal processing performed by the IC chip shown in FIG. 12(A) is performed by the logic circuit 1209 formed from TFT on the same substrate. In this case, the logic circuit 1209 is also constructed basically of the CMOS circuits in the same way as the drive circuits 1203 and 1204.

The AMLCD may have a color filter for color display or may be driven in ECB (electric field control birefringence) mode or GH (guest-host) mode without a color filter.

EXAMPLE 8

The process of the present invention may be used to form CMOS circuits and pixel matrix circuits. These circuits may be used for various electro-optical apparatuses (such as liquid crystal display of active matrix type, EL display of active matrix type, and EC display of active matrix type). In other words, the present invention can be applied to any electronic machines and apparatus equipped with these electro-optical devices as display media.

Examples of these electronic machines and apparatus include video cameras, digital cameras, projectors (of linear type or front type), head-mount display (goggle-type display), car navigation, personal computer, and mobile information terminals (mobile computers, cellular phones, and electronic books). They are illustrated in FIGS. 13 and 14.

Figure 13A:
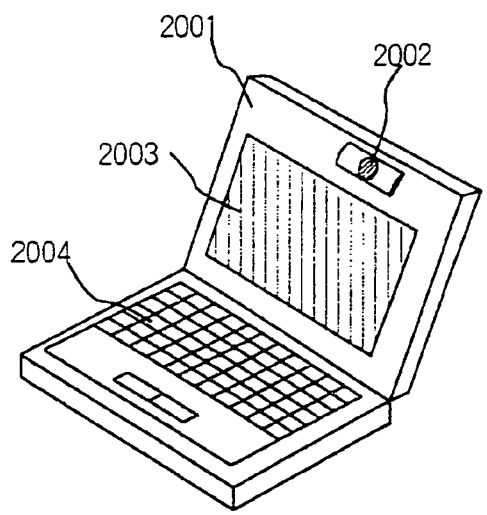
FIGS. 13A-13F are diagrams showing electronic machines and equipment.

FIG. 13(A) shows a personal computer which consists of main body 2001, image input 2002, display 2003, and keyboard 2004. The present invention may be applied to the image input 2002 and the display 2003 and other signal control circuits.

Figure 13B:
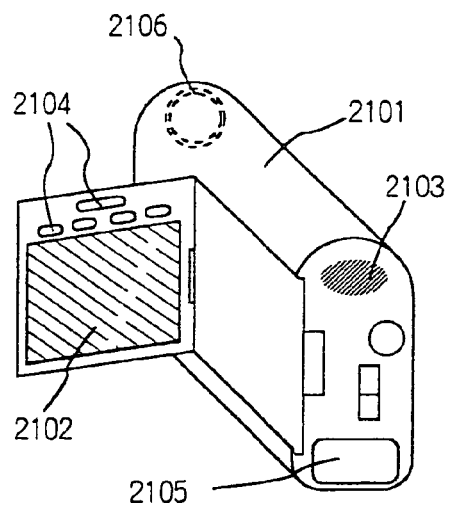

FIG. 13(B) shows a video camera which consists of a main body 2101, a display 2102, an audio input 2103, a switching unit 2104, a battery 2105, and an image receiver 2106. The present invention may be applied to the display 2102 and the video input 2103 and other signal control circuits.

Figure 13C:
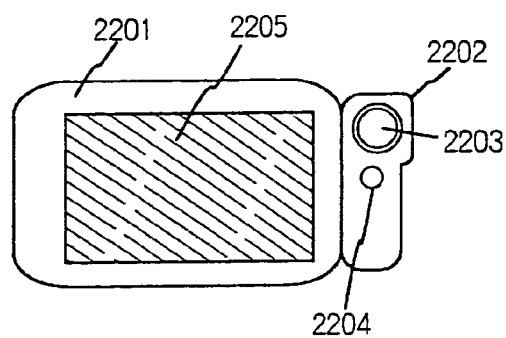

FIG. 13(C) shows a mobile computer which consists of a main body 2201, a camera unit 2202, an image receiver 2203, a switching unit 2204, and a display 2205. The present invention may be applied to the display 2205 and other signal control circuits.

Figure 13D:
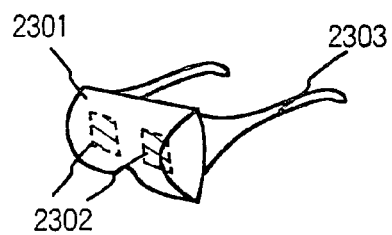

FIG. 13(D) shows a goggle type display which consists of a main body 2301, a display 2302, and arms 2303. The present invention may be applied to the display 2302 and other signal control circuits.

Figure 13E:
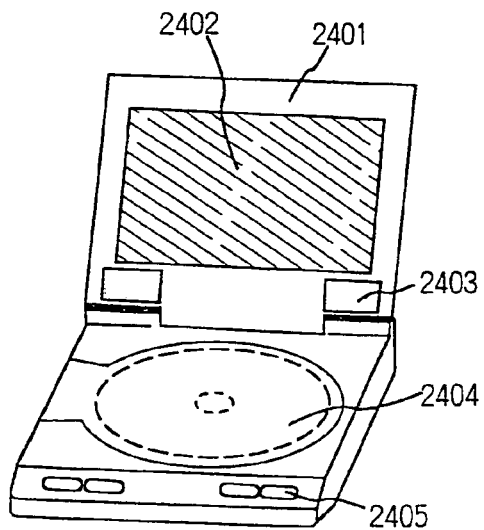

FIG. 13(E) shows a player for a recording medium containing programs, which consists of a main body 2401, a display 2402, a speaker 2403, a recording medium 2404, and a switching unit 2405. Incidentally, this apparatus may employ a DVD (digital versatile disc) or CD as the recording medium. It is used to enjoy music and movies and internet. The present invention may be applied to the display 2402 and other signal control circuits.

Figure 13F:
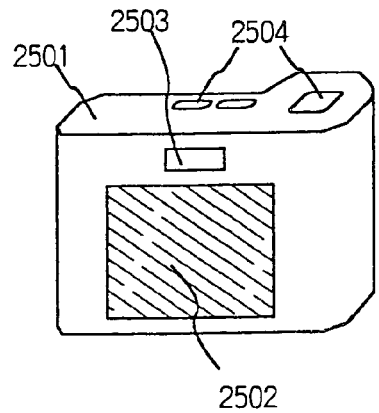

FIG. 13(F) shows a digital camera which consists of a main body 2501, a display 2502, an eyepiece 2503, a switching unit 2504, and an image receiver (not shown). The present invention may be applied to the display 2502 and other signal control circuits.

Figure 14A:
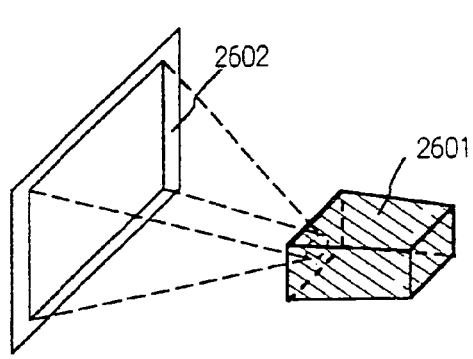
FIGS. 14A-14D illustrates front and rear-type projections in accordance with the present invention.

FIG. 14(A) shows a front-type projector which consists of a display 2601 and a screen 2602. The present invention may be applied to the display and other signal control circuits.

Figure 14B:
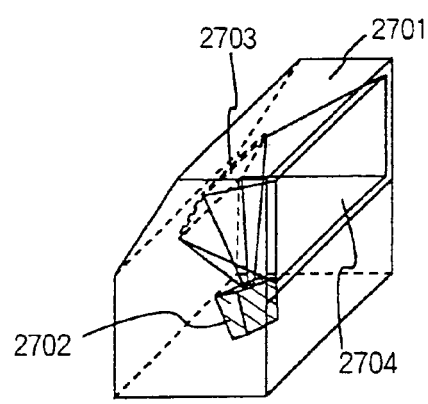

FIG. 14(B) is a rear-type projector which consists of a main body 2701, a display 2702, a mirror 2703, and a screen 2704. The present invention may be applied to the display and other signal control circuits.

Figure 14C:
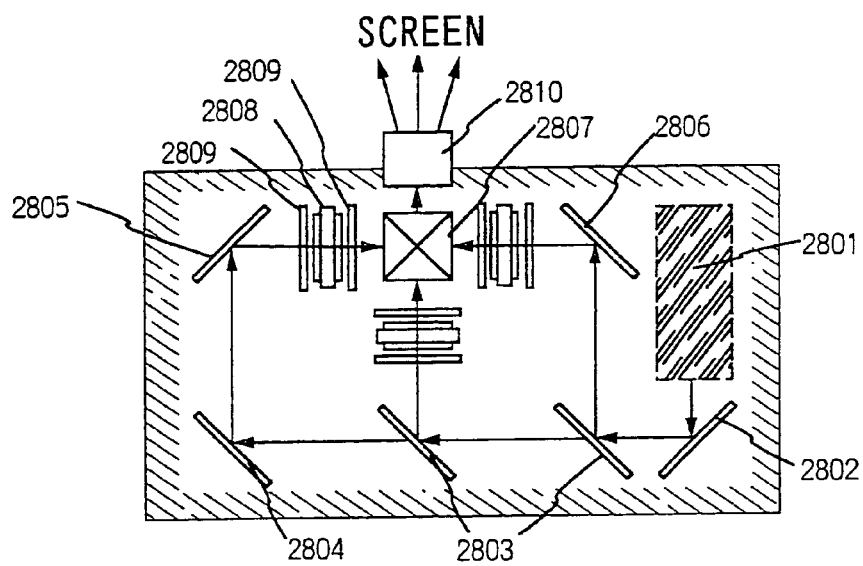

FIG. 14(C) shows an example of the structure of the display 2601 and 2702 in FIGS. 14(A) and 14(B), respectively. The displays 2601 and 2702 each consist of an optical system for light source 2801, mirrors 2802, 2804-2806, a dichroic mirror 2803, a prism 2807, a liquid crystal display 2808, a phase difference plate 2809, and a projecting optical system 2810. The projecting optical system 2810 contains projector lenses. This example shows the one which contains three lenses. The one which has a single lens may also be possible. Incidentally, the example shown in FIG. 14(C) may be modified such that the arrowed optical paths may be provided with such optical elements as lenses, polarizing film, phase difference adjusting film, and IR film.

Figure 14D:
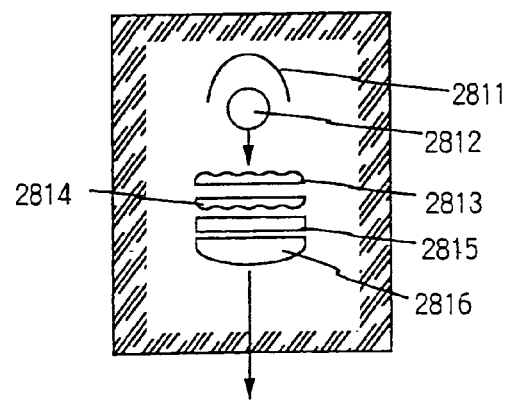

FIG. 14(D) shows an example of the structure of the light source optical system 2801 in FIG. 14(C). The light source optical system 2801 consists of a reflector 2811, a light source 2812, lens arrays 2813 and 2814, a polarizing light converting element 2815, and a condenser lens 2816. The light source optical system shown in FIG. 14(D) is illustrative only but is not limitative. For example, the light source optical system may be provided with such optical elements as lenses, polarizing film, phase difference adjusting film, and IR film.

As mentioned above, the present invention may be applied to a broad range of fields, including almost all electronic machines and equipment. And, the electronic machines and equipment in this example may be realized by any combination of Examples 1 to 8.

The present invention enables one to produce a semiconductor device having good TFT characteristics even when heat treatment at a high temperature (400° C. and above) is performed after the gate wiring and electrode (wiring width: 0.1-5 μm) have been formed.

According to the present invention, the protective film prevents impurity from diffusing from the substrate during heat treatment at a high temperature. This makes it possible to obtain good TFT characteristics without being affected by the concentration of impurity in the substrate.

The heat treatment at a high temperature (400° C. and above), which is performed after the addition of impurity to impart p-type or n-type conductivity type, produces the effect of activating impurity, annealing the crystalline semiconductor film which has been damaged by impurity addition, and reducing the catalyst element remaining in the crystalline semiconductor film (gettering effect).

What is claimed is:

1. A semiconductor device comprising:
 a substrate;
 a gate electrode having a multi-layer structure formed over the substrate;

a semiconductor layer formed over the gate electrode with first and second inorganic insulating layers interposed therebetween, the first inorganic insulating layer including silicon nitride and the second inorganic insulating layer including silicon nitride;

a source or drain region formed in the semiconductor layer;

a metal silicide formed on the source or drain region;

a silicon nitride film formed over the semiconductor layer; and an organic resin layer formed in contact with the silicon nitride film.

2. The semiconductor device according to claim 1, wherein the gate electrode comprises at least one layer comprising a material selected from the group consisting of tantalum, molybdenum, titanium, chromium and silicon.

3. An electronic device having the semiconductor device according to claim 1, wherein the electronic device is selected from the group consisting of a personal computer, a video camera, a mobile computer, a goggle-type display, a player for a recording medium, a digital still camera, a front-type projector and a rear-type projector.

4. The semiconductor device according to claim 1, wherein an uppermost layer of the gate electrode having a multi-layer structure comprises titanium.

5. The semiconductor device according to claim 1, wherein the gate electrode having a multi-layer structure comprises:
  a first layer comprising tantalum and nitrogen;
  a second layer comprising tantalum formed over the first layer; and
  a third layer comprising titanium formed over the second layer.

6. A semiconductor device comprising:
  a substrate;
  a gate electrode having a multi-layer structure formed over the substrate;
  a semiconductor layer formed over the gate electrode with first and second inorganic insulating layers interposed therebetween, the first inorganic insulating layer including silicon nitride and the second inorganic insulating layer including silicon nitride;
  a channel region and a source or drain region formed in the semiconductor layer;
  a metal silicide formed on the source or drain region;
  a silicon nitride film formed over the channel region; and
  an organic resin layer formed in contact with the silicon nitride film.

7. The semiconductor device according to claim 6, wherein the gate electrode comprises at least one layer comprising a material selected from the group consisting of tantalum, molybdenum, titanium, chromium and silicon.

8. An electronic device having the semiconductor device according to claim 6, wherein the electronic device is selected from the group consisting of a personal computer, a video camera, a mobile computer, a goggle-type display, a player for a recording medium, a digital still camera, a front-type projector and a rear-type projector.

9. The semiconductor device according to claim 6, wherein an uppermost layer of the gate electrode having a multi-layer structure comprises titanium.

10. The semiconductor device according to claim 6, wherein the gate electrode having a multi-layer structure comprises:
  a first layer comprising tantalum and nitrogen;
  a second layer comprising tantalum formed over the first layer; and
  a third layer comprising titanium formed over the second layer.

11. A semiconductor device comprising:
  a substrate;
  a gate electrode having a multilayer structure formed over the substrate;
  a semiconductor layer formed over the gate electrode with first and second inorganic insulating layers interposed therebetween, the first inorganic insulating layer including silicon nitride and the second inorganic insulating layer including silicon nitride;
  a source or drain region formed in the semiconductor layer;
  a metal silicide formed on the source or drain region;
  an oxide film formed over the semiconductor layer;
  a silicon nitride film formed over the oxide film; and
  an organic resin layer formed in contact with the silicon nitride film.

12. The semiconductor device according to claim 11, wherein the gate electrode comprises at least one layer comprising a material selected from the group consisting of tantalum, molybdenum, titanium, chromium and silicon.

13. An electronic device having the semiconductor device according to claim 11, wherein the electronic device is selected from the group consisting of a personal computer, a video camera, a mobile computer, a goggle-type display, a player for a recording medium, a digital still camera, a front-type projector and a rear-type projector.

14. The semiconductor device according to claim 11, wherein an uppermost layer of the gate electrode having a multi-layer structure comprises titanium.

15. The semiconductor device according to claim 11, wherein the gate electrode having a multi-layer structure comprises:
  a first layer comprising tantalum and nitrogen;
  a second layer comprising tantalum formed over the first layer; and
  a third layer comprising titanium formed over the second layer.

16. The semiconductor device according to claim 1, wherein the metal silicide includes one selected from the group consisting of cobalt, titanium, tantalum, tungsten and molybdenum.

17. The semiconductor device according to claim 6, wherein the metal silicide includes one selected from the group consisting of cobalt, titanium, tantalum, tungsten and molybdenum.

18. The semiconductor device according to claim 11, wherein the metal suicide includes one selected from the group consisting of cobalt, titanium, tantalum, tungsten and molybdenum.

* * * * *

UNITED STATES PATENT AND TRADEMARK OFFICE
CERTIFICATE OF CORRECTION

PATENT NO. : 7,709,844 B2 Page 1 of 1
APPLICATION NO. : 11/480429
DATED : May 4, 2010
INVENTOR(S) : Shunpei Yamazaki et al.

It is certified that error appears in the above-identified patent and that said Letters Patent is hereby corrected as shown below:

At column 18, line 55, please change "suicide" to --silicide--.

Signed and Sealed this

Seventeenth Day of August, 2010

David J. Kappos
*Director of the United States Patent and Trademark Office*